(12) United States Patent
Patel et al.

(10) Patent No.: US 9,089,085 B2
(45) Date of Patent: *Jul. 21, 2015

(54) PROTECTIVE MATERIAL APPLICATOR DEVICE

(71) Applicant: Superior Communications, Inc., Irwindale, CA (US)

(72) Inventors: Shraddha Patel, Walnut, CA (US); Charlie LaColla, Woodland Hills, CA (US); Thai Dinh, Huntington Beach, CA (US); Vivian Chou, Diamond Bar, CA (US)

(73) Assignee: Superior Communications, Inc., Irwindale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/794,414

(22) Filed: Mar. 11, 2013

(65) Prior Publication Data

US 2013/0199714 A1 Aug. 8, 2013

Related U.S. Application Data

(63) Continuation of application No. 13/208,264, filed on Aug. 11, 2011, now Pat. No. 8,393,377, which is a continuation-in-part of application No. 13/053,081, filed on Mar. 21, 2011.

(60) Provisional application No. 61/444,597, filed on Feb. 18, 2011.

(51) Int. Cl.
*B32B 38/10* (2006.01)
*B29C 63/02* (2006.01)
(Continued)

(52) U.S. Cl.
CPC ............ *H05K 13/00* (2013.01); *B29C 63/0004* (2013.01); *B29C 63/0047* (2013.01);
(Continued)

(58) Field of Classification Search
CPC B29C 63/0004; B29C 63/0047; B29C 63/02; B29C 2063/0008; Y10T 156/1168; Y10T 156/1195; Y10T 156/1978; Y10T 156/1994
USPC .................. 156/574, 249, 714, 719, 764, 767
See application file for complete search history.

(56) References Cited

U.S. PATENT DOCUMENTS 2,187,585 A 1/1940 Grigas
2,719,663 A 10/1955 Meyer-Jagenberg
(Continued)

FOREIGN PATENT DOCUMENTS

DE 102008024339 11/2009
DE 202014000383 U1 * 2/2014
(Continued)

OTHER PUBLICATIONS

EcoSwitch Newsletter, Nov. 2007, 4 pages.

*Primary Examiner* — Mark A Osele
(74) *Attorney, Agent, or Firm* — Snell & Wilmer LLP

(57) ABSTRACT

Devices, methods and systems disclosed herein relate to the application of a protective film on a surface of an electronic device that instantly reduces air bubbles and eliminates the waiting time usually required when using a wet fluid solution. In one embodiment, a roller device may include a carriage or housing and one or more rollers coupled or integrated with the housing, configured to apply a protective material to a surface of the electronic device in a first orientation, and configured to function as a device stand in a second orientation. In addition or alternatively, a roller guide apparatus and/or a wedge may be utilized to assist the roller device in applying the protective material to the surface of the electronic device.

15 Claims, 43 Drawing Sheets

(51) Int. Cl.
  *H05K 13/00* (2006.01)
  *B32B 37/00* (2006.01)
  *B29C 63/00* (2006.01)

(52) U.S. Cl.
  CPC ............. *B29C63/02* (2013.01); *B29C 63/0056* (2013.01); *B29C 2063/0008* (2013.01); *B32B 37/0046* (2013.01); *B32B 38/10* (2013.01); *Y10T 156/1168* (2015.01); *Y10T 156/1195* (2015.01); *Y10T 156/17* (2015.01); *Y10T 156/1788* (2015.01); *Y10T 156/1978* (2015.01); *Y10T 156/1994* (2015.01)

(56) References Cited

U.S. PATENT DOCUMENTS

| | | | |
|---|---|---|---|
| 2,828,501 A | 4/1958 | Brown, Sr. | |
| 2,847,151 A | 8/1958 | Meyer-Jagenberg | |
| 3,127,299 A | 3/1964 | Hecht | |
| 3,156,603 A | 11/1964 | Robinson | |
| 3,208,899 A * | 9/1965 | Bicher, Jr. | 156/536 |
| 3,650,209 A | 3/1972 | Allport | |
| 3,709,760 A | 1/1973 | Knoner | |
| 3,881,979 A | 5/1975 | Kelly | |
| 3,907,628 A | 9/1975 | Buske | |
| 4,648,935 A | 3/1987 | Brown | |
| 5,068,951 A | 12/1991 | Abrams | |
| 5,069,732 A | 12/1991 | Levine | |
| 5,437,593 A | 8/1995 | Gustavsen | |
| 5,545,287 A | 8/1996 | Carlson | |
| 5,562,262 A | 10/1996 | Pennell | |
| 5,637,177 A | 6/1997 | Os | |
| 6,054,009 A | 4/2000 | Cote | |
| 6,478,068 B1 | 11/2002 | Brown | |
| 6,481,572 B2 | 11/2002 | Wien | |
| 6,491,775 B1 * | 12/2002 | Janssen et al. | 156/108 |
| 6,514,588 B2 | 2/2003 | Rosenbaum et al. | |
| 6,536,589 B2 | 3/2003 | Chang | |
| 6,754,092 B2 | 6/2004 | McDowell | |
| 6,802,741 B1 | 10/2004 | Shatkin | |
| 6,925,684 B2 | 8/2005 | Kang et al. | |
| 6,941,632 B1 | 9/2005 | Mead et al. | |
| 7,077,185 B2 | 7/2006 | Steinberger | |
| 7,226,521 B2 | 6/2007 | Steinhardt et al. | |
| 7,249,976 B1 | 7/2007 | Watson | |
| D556,448 S | 12/2007 | Brandenburg | |
| D559,230 S | 1/2008 | Griffin et al. | |
| D559,529 S | 1/2008 | Griffin et al. | |
| 7,315,097 B2 | 1/2008 | Tajika | |
| 7,349,004 B2 | 3/2008 | Priestman et al. | |
| D575,056 S | 8/2008 | Tan | |
| 7,441,581 B2 | 10/2008 | Pitzen | |
| D582,875 S | 12/2008 | Haspil et al. | |
| 7,505,072 B2 | 3/2009 | Saitoh | |
| 7,540,933 B2 | 6/2009 | Dugas et al. | |
| 7,617,079 B2 | 11/2009 | Stewart et al. | |
| 7,663,878 B2 | 2/2010 | Swan et al. | |
| 7,778,023 B1 | 8/2010 | Mohoney | |
| 7,784,610 B2 | 8/2010 | Mason | |
| 7,910,833 B2 | 3/2011 | McGinley et al. | |
| 7,923,869 B2 | 4/2011 | Bagenholm et al. | |
| 7,957,524 B2 | 6/2011 | Chipping | |
| 7,960,648 B2 | 6/2011 | McGinley et al. | |
| 8,015,651 B2 | 9/2011 | Knopow et al. | |
| 8,393,377 B2 | 3/2013 | Patel | |
| 8,517,367 B1 * | 8/2013 | Napier | 269/289 R |
| 9,033,019 B2 * | 5/2015 | Patel et al. | 156/528 |
| 2003/0232167 A1 | 12/2003 | Wimmershoff et al. | |
| 2004/0174665 A1 | 9/2004 | Mockridge et al. | |
| 2004/0194896 A1 | 10/2004 | Steinberger | |
| 2005/0070328 A1 | 3/2005 | Wang et al. | |
| 2005/0287953 A1 | 12/2005 | Ikeda et al. | |
| 2006/0096713 A1 | 5/2006 | Chen | |
| 2006/0096714 A1 | 5/2006 | Chen | |
| 2006/0128417 A1 | 6/2006 | Wilson | |
| 2006/0258325 A1 | 11/2006 | Tsutaichi et al. | |
| 2007/0029458 A1 | 2/2007 | Wang et al. | |
| 2007/0107828 A1 | 5/2007 | Barker et al. | |
| 2007/0143946 A1 | 6/2007 | Kim | |
| 2008/0041529 A1 | 2/2008 | King | |
| 2008/0290731 A1 | 11/2008 | Cassidy | |
| 2009/0001232 A1 | 1/2009 | Seo et al. | |
| 2009/0017883 A1 | 1/2009 | Lin | |
| 2009/0027922 A1 | 1/2009 | Tracy et al. | |
| 2009/0038927 A1 | 2/2009 | Guo et al. | |
| 2009/0047415 A1 * | 2/2009 | Jiang et al. | 427/8 |
| 2009/0186181 A1 | 7/2009 | Mase | |
| 2009/0213630 A1 | 8/2009 | Wu | |
| 2009/0247237 A1 | 10/2009 | Mittleman et al. | |
| 2011/0117977 A1 | 5/2011 | Yamashita et al. | |
| 2012/0046002 A1 | 2/2012 | Hill et al. | |
| 2012/0057287 A1 * | 3/2012 | Chaves et al. | 361/679.3 |
| 2012/0110868 A1 * | 5/2012 | Abbondanzio | 33/645 |
| 2012/0211171 A1 | 8/2012 | Patel et al. | |
| 2013/0020020 A1 * | 1/2013 | Liu | 156/247 |
| 2013/0048203 A1 * | 2/2013 | Yau et al. | 156/230 |
| 2013/0133807 A1 | 5/2013 | Wang et al. | 156/60 |
| 2013/0237296 A1 * | 9/2013 | Chen | 455/575.8 |
| 2013/0255874 A1 * | 10/2013 | Tapio et al. | 156/249 |
| 2013/0299075 A1 * | 11/2013 | Colby et al. | 156/249 |
| 2014/0027050 A1 * | 1/2014 | Napier, Keiko | 156/249 |
| 2014/0124146 A1 | 5/2014 | Patel et al. | |
| 2014/0130971 A1 * | 5/2014 | Wu et al. | 156/249 |
| 2014/0338829 A1 * | 11/2014 | Peng et al. | 156/249 |
| 2015/0000831 A1 * | 1/2015 | Wang | 156/230 |
| 2015/0013890 A1 * | 1/2015 | Rostami | 156/249 |
| 2015/0041069 A1 * | 2/2015 | Wadsworth et al. | 156/535 |
| 2015/0047773 A1 * | 2/2015 | Wadsworth et al. | 156/182 |

FOREIGN PATENT DOCUMENTS

| | | |
|---|---|---|
| EP | 2279864 | 2/2011 |
| GB | 2438655 | 12/2007 |
| GB | 2443454 | 5/2008 |
| JP | 10199422 | 7/1998 |
| KR | 20030032392 | 4/2003 |
| WO | 2008/062174 | 5/2008 |

* cited by examiner

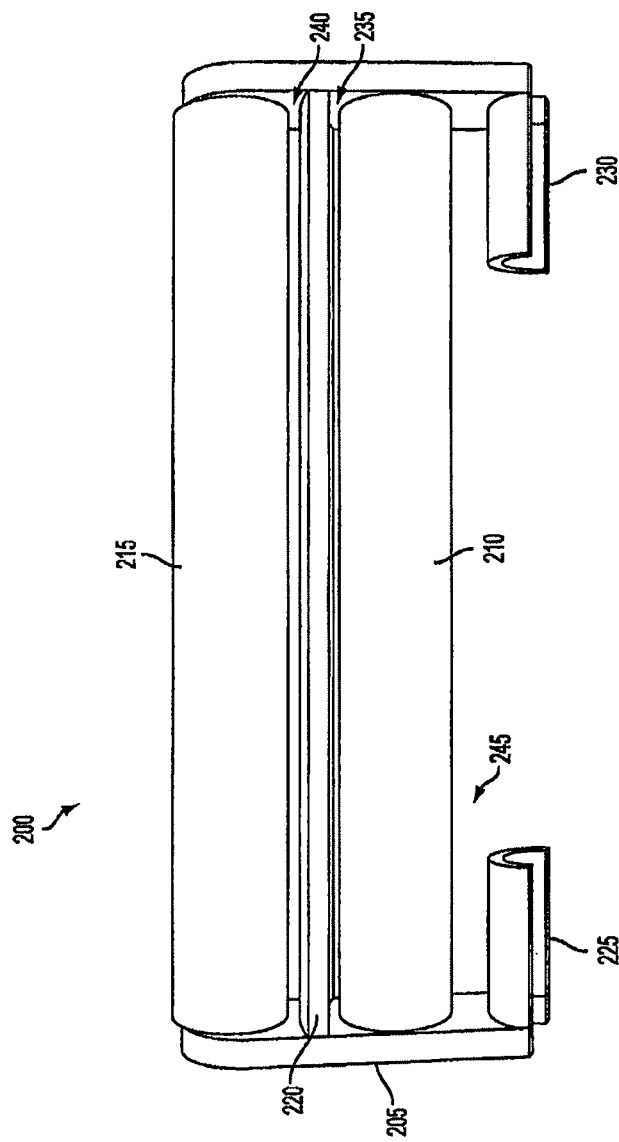

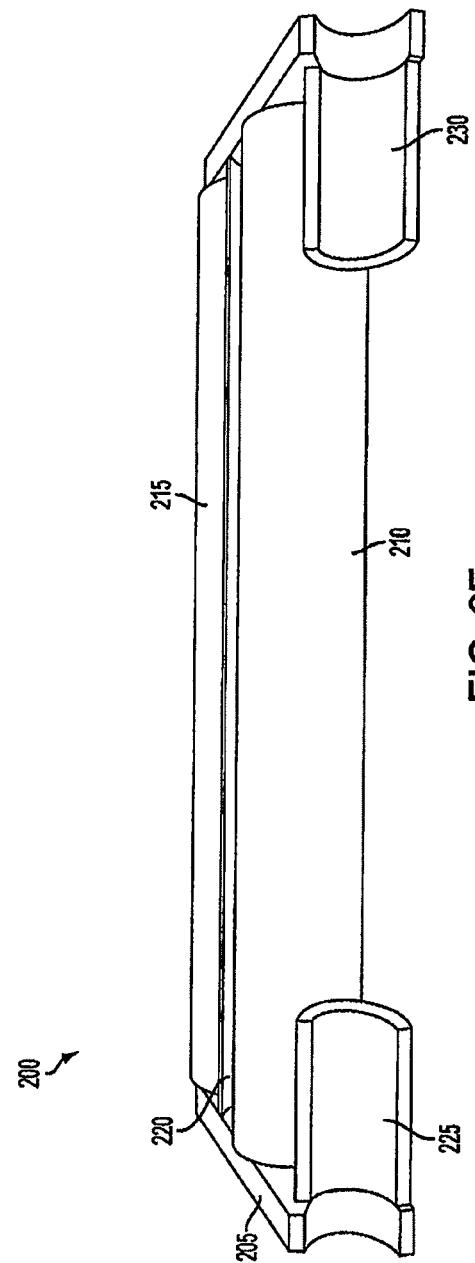

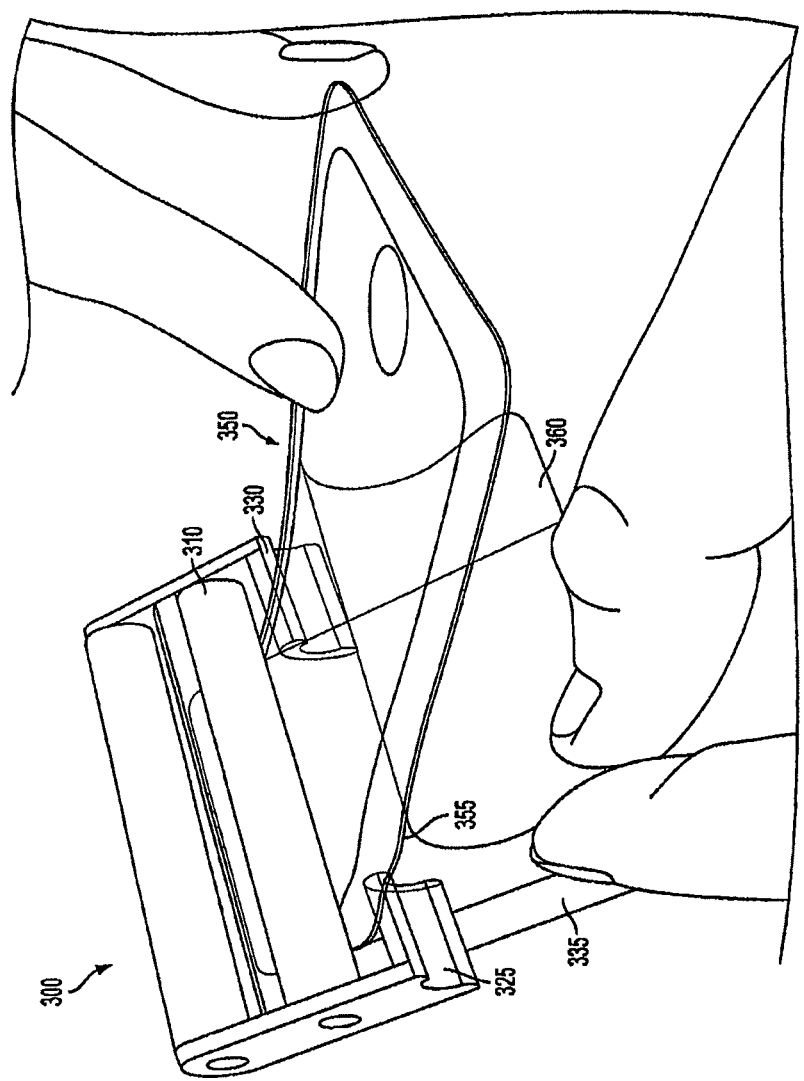

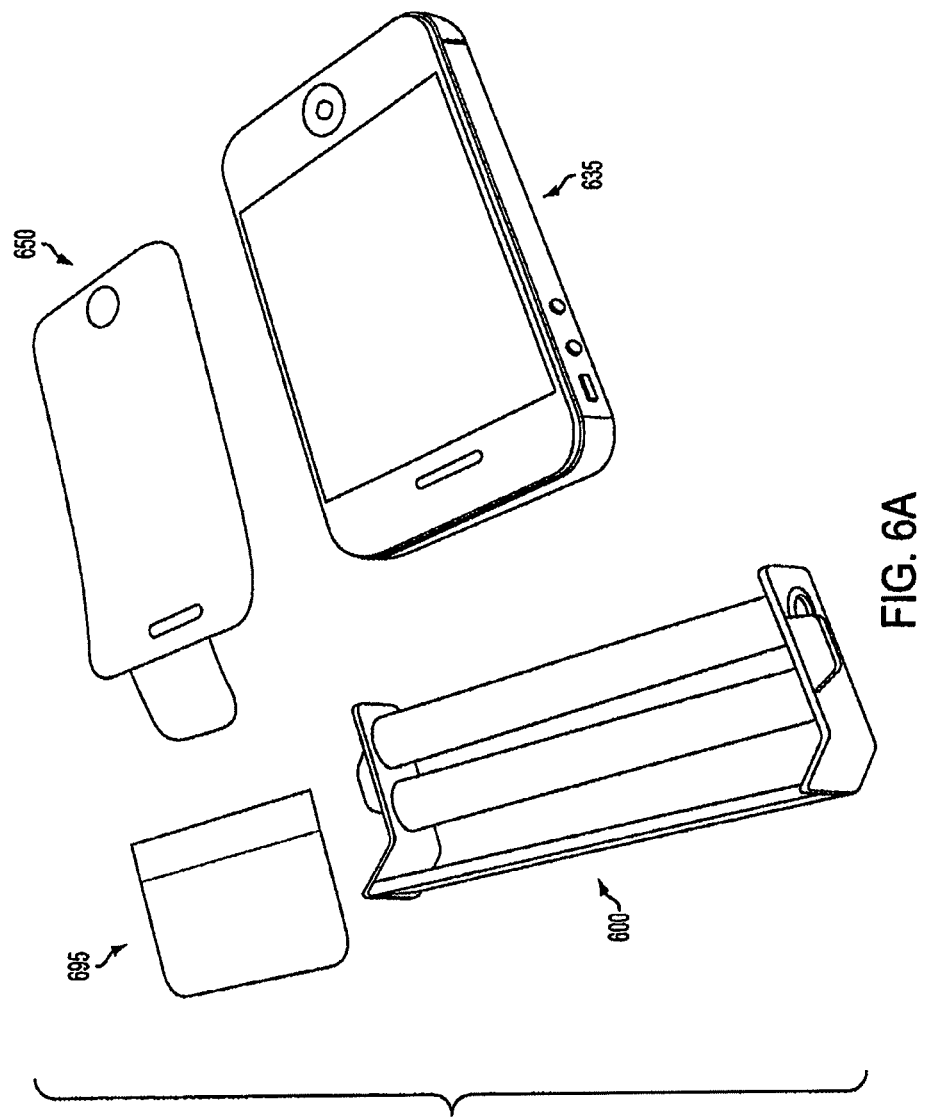

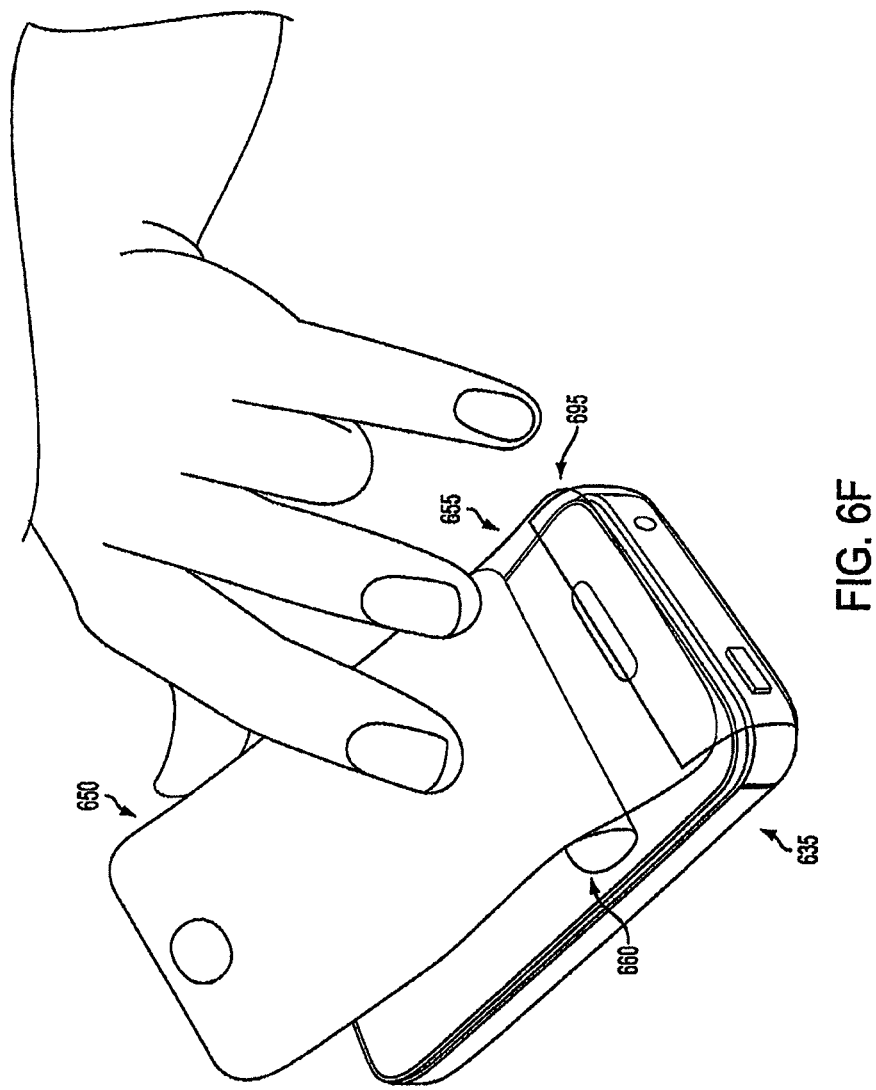

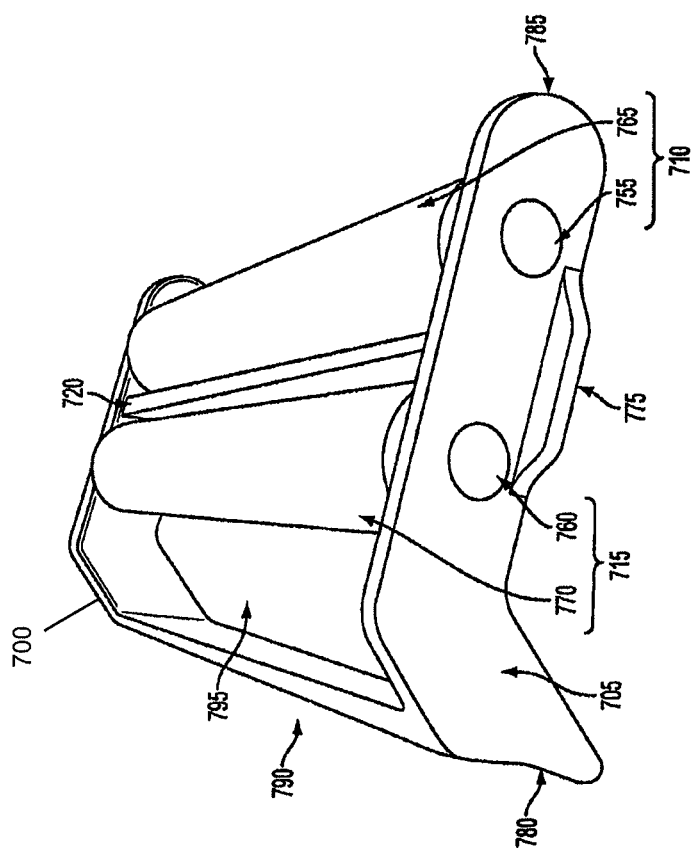

PROTECTIVE MATERIAL APPLICATOR DEVICE

CROSS REFERENCE TO RELATED APPLICATIONS

This application is a continuation of U.S. patent application Ser. No. 13/208,264 entitled "PROTECTIVE MATERIAL APPLICATOR DEVICE" filed on Aug. 11, 2011, now U.S. Pat. No. 8,393,377, which is a continuation-in-part of U.S. patent application Ser. No. 13/053,081 entitled "PROTECTIVE MATERIAL APPLICATOR DEVICE" filed on Mar. 21, 2011, which in turn claims the benefit of and the priority of U.S. Provisional Application No. 61/444,597 filed on Feb. 18, 2011. The entire contents of all of these applications are hereby incorporated by reference herein.

BACKGROUND

1. Field

The present invention relates to an apparatus, method and/or system for applying a protective material or layer to a surface of a device. For example, the present invention may allow a user to apply a protective material or layer to the surface or screen of an electronic device.

2. Description of Related Art

Electronic devices such as cellular phones, portable tablet computers and the like are gaining widespread popularity. For example, the Apple® iPhone® is estimated to reach 100 million users by the end of 2011. In addition, almost 15 million Apple® iPads® have been sold to date. The sheer volume of electronic devices sold by other major competitors such as Motorola®, Samsung®, HTC®, etc. only further confirms that consumers find these products very desirable. It should not come as a surprise that these same consumers want to protect their products from accidental denting, scratching or otherwise damaging these electronic devices. Accordingly, manufacturers have produced different cases, protective films and the like to help the consumer keep their electronic devices safe.

However, with the progress of touch-based screens for operating these electronic devices, thick cases might not be suitable, as these cases may prevent the user from operating the device. Accordingly, many manufacturers are now producing clear films that keep, for example, the display of the electronic device clean while at the same time protecting the screen from accidental damage such as scratching.

Despite the benefits that these films or screen protectors provide, many drawbacks remain in this relatively new technology. For example, many of these protectors require the use of a wet fluid solution to enable the film to adhere to the electronic device. Using a wet fluid solution is messy, requires a lot of work by the user to "squeegee" the excess out, and might not eliminate all annoying air bubbles immediately. Indeed, many of these products warn that 24-48 hours may be needed before the user can effectively determine if the trapped air bubbles are going to disappear. In other words, some consumers may have to wait for days before determining if the film was applied correctly. To some consumers, this long wait is annoying and may reduce the enthusiasm of an otherwise exciting moment of obtaining a cutting-edge electronic device. Moreover, the electronic device might not be functional until the solution dries out in 24-48 hours. Alternatively, the consumer might not want to risk using the device in fear during this time period as he or she may believe that usage may impact the film prior to drying of the wet fluid solution.

What is needed is an applicator that eliminates the drawbacks above and allows a user to apply the protective film effectively for use without waiting for the protective film to dry and/or waiting for the air bubbles to disappear.

SUMMARY

Devices, methods and systems are provided to apply a protective film on a surface of an electronic device which reduces or eliminates air bubbles and eliminates the waiting time usually required when using a wet fluid solution.

In one embodiment, a roller apparatus may be used in a protective film application process to eliminate air bubbles and assist the user in applying the film to the electronic device correctly. The roller apparatus may include a carriage or housing, one or more rollers coupled to or integrated with the housing and a splitter configured to separate the protective film from a backing material during the application process.

In one embodiment, the roller apparatus may be configured to be maneuvered into position with the splitter between the exposed portion of the protective film and the backing with the roller portion of the roller apparatus trailing behind. As the user pulls the roller apparatus from a first edge of the electronic device to a second edge of the electronic device, the protective film may be removed from the backing, applied to the device, and any air bubbles may be immediately squeezed out such that in one motion the protective film may be applied to the electronic device without the use of a wet fluid solution.

In one embodiment, a method of applying the protective film to an electronic device is provided. For example, first, a user may remove one edge of the protective film from a backing and line up the removed edge of the protective film with the corresponding edge of the electronic device. No wet fluid solution is sprayed on or applied to the surface or screen of the electronic device. Next, the roller apparatus may be maneuvered into position with the splitter between the exposed portion of the protective film and the backing with the roller portion of the roller apparatus trailing behind. As the user pulls the roller apparatus from a first edge of the electronic device to a second edge of the electronic device, the protective film may be removed from the backing, applied to the device, and any air bubbles may be immediately eliminated such that in one motion the protective film may be applied to the electronic device without the use of a wet fluid solution.

In one embodiment, for example, where the protective film includes an overlay portion intended to be pressed down on the sides perpendicular or orthogonal to the main surface, the user may press the protective film down on the intended, corresponding areas and use the roller portion of the roller apparatus to further press down on the protective film.

In one embodiment, a roller apparatus may include an integrated stand for propping up or holding the electronic device. In a first operational configuration, the roller apparatus may be used in a protective film application process to eliminate air bubbles and assist the user in applying the film to the electronic device correctly. In a second operational configuration, the roller apparatus may be used as a stand for propping up the electronic device. The roller apparatus may include a carriage or housing, one or more rollers coupled or integrated with the housing and a stand portion for propping up the electronic device.

In one embodiment, to further assist the user in applying the protective film, a roller apparatus guide may be used in conjunction with a roller apparatus. The roller apparatus guide may be a substantially rectangular block having three or more portions including an inner wall defining a cavity used to receive or mount a mobile communication device, a roller supporting surface configured to be flush with a mounted mobile communication device and a set of roller guiding rails which may be parallel to one another and raised above the roller supporting surface. In addition, the roller apparatus guide may include pressing portions to assist the user when applying the protective film.

In one embodiment, a film application system may include a roller apparatus, a roller apparatus guide, a mobile communication device, a protective film to be applied to a mobile communication device, and a wedge. Here, a wedge is incorporated to help the user apply the film to the mobile communication device. The wedge may be substantially triangular in shape, although minor variations are allowed provided that the functionality of the wedge remains. The wedge may comprise three adjacent, connected surfaces forming the structure of the wedge. The spacing created by the connecting of surfaces may be hollow or, in one embodiment, may be filled. The wedge may function to assist in removing the backing of the film during the film application process.

BRIEF DESCRIPTION OF THE DRAWINGS

The features, obstacles, and advantages of the present invention will become more apparent from the detailed description set forth below when taken in conjunction with the drawings, wherein:

FIG. 2A illustrates a top view of a roller apparatus according to one or more embodiments described herein;

FIG. 2E illustrates a rear perspective view of a roller apparatus according to one or more embodiments described herein;

FIG. 3B illustrates a roller apparatus set-up configuration according to one or more embodiments described herein;

FIG. 6A illustrates a roller apparatus with an integrated stand, a protective film, a film tab and an electronic device according to one or more embodiments described herein;

FIG. 6F illustrates a protective material set-up configuration according to one or more embodiments described herein;

FIG. 7C illustrates a perspective side view of a roller apparatus with an integrated stand according to one or more embodiments described herein;

DETAILED DESCRIPTION

Apparatus, systems and/or methods that implement the embodiments of the various features of the present invention will now be described with reference to the drawings. The drawings and the associated descriptions are provided to illustrate some embodiments of the present invention and not to limit the scope of the present invention. Throughout the drawings, reference numbers are re-used to indicate correspondence between referenced elements.

Figure 1:
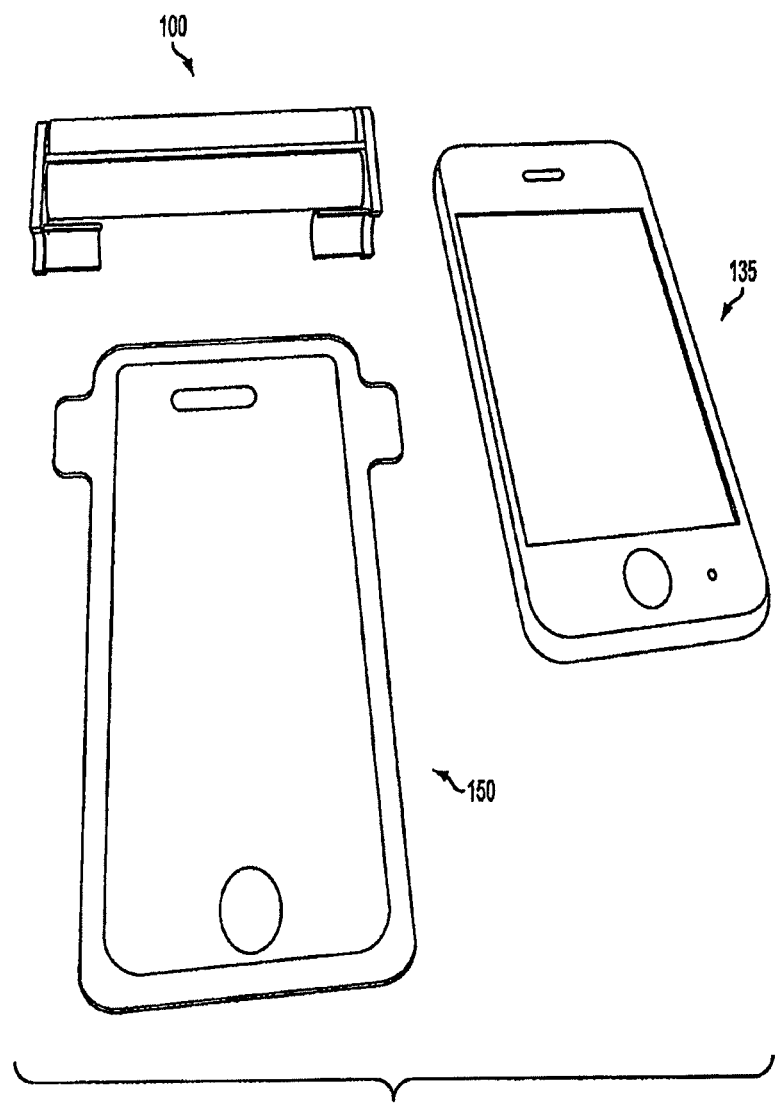
FIG. 1 illustrates a roller apparatus, a protective film and an electronic device according to one or more embodiments described herein.

FIG. 1 illustrates a roller apparatus 100, an electronic device 135 and a film 150. The roller apparatus 100 may be used to apply the film 150 to a surface of the electronic device 135. The film 150 may protect the electronic device 135 from damage (e.g., scratches) and/or smudges. As shown, the roller apparatus 100 may have a width wider than the width of the electronic device 135 and the film 150. In this manner, the roller apparatus 100 may be configured to apply films of varying sizes onto devices of varying sizes. In addition, the roller apparatus 100 may be configured to apply the film 150 to a device with a curved surface (not shown). In one embodiment, the roller apparatus 100 may be increased in size or decreased in size (along with the appropriate proportions) for usage with significantly larger films and devices (e.g., a tablet PC).

FIG. 2A illustrates one embodiment of a roller apparatus 200. As shown, the roller apparatus 200 may include a roller base or carriage 205, a first or front roller 210, a second or back roller 215, a mid-bar 220, a first or left splitter 225 and a second or right splitter 230. The roller base 205 may be constructed out of a rigid material such as a plastic, a metal, a wood and the like. The roller base 205 is configured to provide structural support for the roller apparatus 200. In addition, the roller base 205 may be sized to be easily manipulated and graspable by a user's hand. The roller base 205 may be configured to hold the first roller 210 in place and allow the first roller 210 to "roll" or rotate about a longitudinal axis created by the roller base 205. In one example, the roller base 205 may be structured to include a first rod member (not shown) spanning the entire length of the first roller 210, thereby forming an axis for the first roller 210 to rotate about. The first roller 210 is configured to rotate and apply physical pressure on a film (e.g., film 150 of FIG. 1) in operation. The first roller 210 may be separated from the mid bar 220 by a first roller gap 235 and may be further separated from the first splitter 225 and the second splitter 230 by a splitter gap 245. These gaps (e.g., the first roller gap 235 and the splitter gap 245) may serve as structural openings to allow the first roller 210 to rotate freely. The second roller 215 may be a redundant pressure applicator and may be substantially the same size as, and substantially parallel to the first roller 210. The first roller 210 and the second roller 215 may be separated by a mid bar 220. The mid bar 220 may connect the two ends of the roller base 205 and provide the entire roller apparatus with stability. In addition, a gap 240 may exist between the mid bar 220 the second roller 215 to allow the second roller 215 to rotate freely. The first splitter 225 and the second splitter 230 may lie along the same plane and may be slightly curved. The splitters 225 and 230 may be configured to be rigid and may function to separate an adhesive portion of a film (e.g., film 150) from its non-adhesive backing during the application process.

Figure 2B:
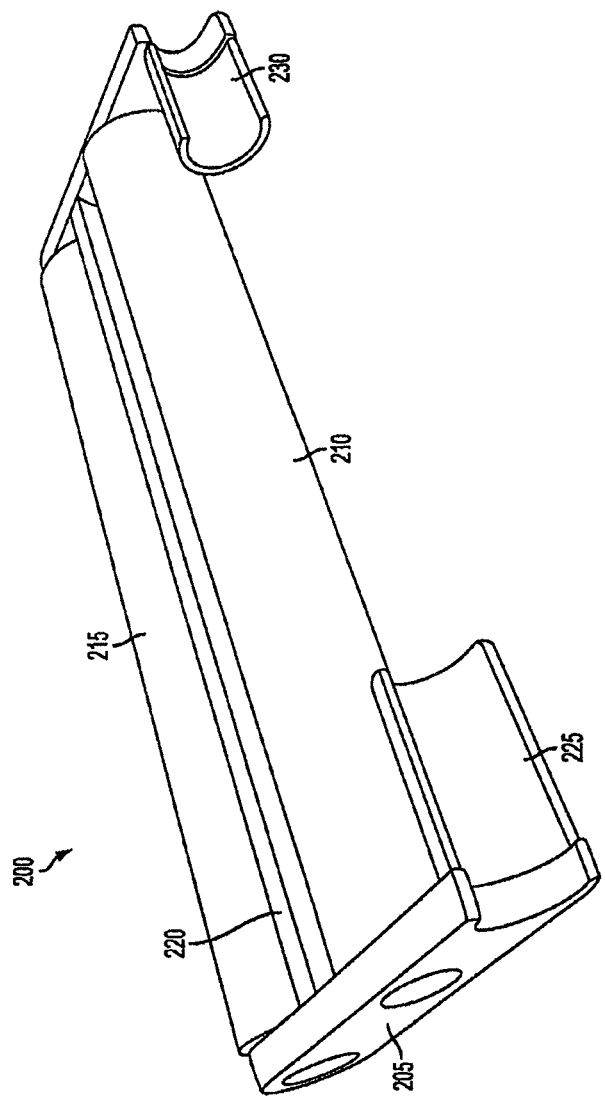
FIG. 2B illustrates a perspective view of a roller apparatus according to one or more embodiments described herein.

FIG. 2B is a perspective view of the roller apparatus 200. In one embodiment, the roller apparatus 200 may be configured to function as a film applicator for phone-sized devices and may have a length of 1-2 inches, a width of 2-4 inches, and a height of 0.5-1 inch. In one embodiment, the roller apparatus 200 may be configured to function as a film applicator for tablet-sized devices and may have a length of 1-5 inches, a width of 8-12 inches, and a height of 0.5-2 inches. Other dimensions are also possible depending on the size of the device to be protected and/or depending on the size of the film to be applied.

Figure 2C:
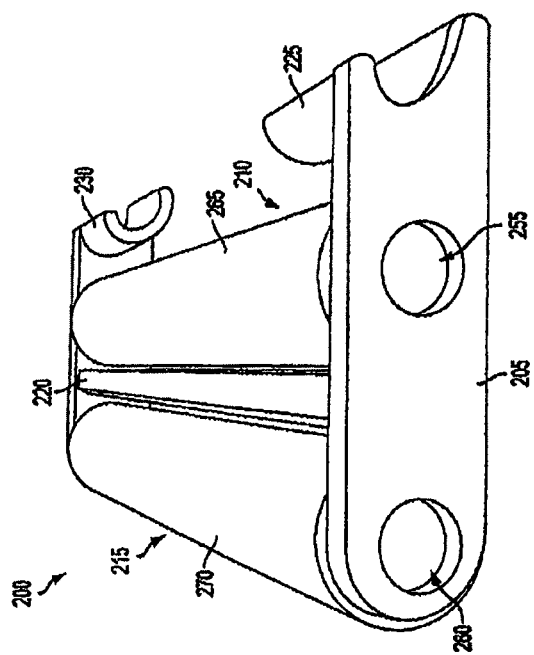
FIG. 2C illustrates a side perspective view of a roller apparatus according to one or more embodiments described herein.

FIG. 2C is a side perspective view of the roller apparatus 200. As shown, the rollers 210 and 215 may include inner cores 255 and 260, respectively. In addition, the rollers 210 and 215 may include outer cores 265 and 270, respectively. In one embodiment, the outer cores 265 and 270 may be configured to "flatten" at the point of contact and thereby providing pressure in a more uniform and distributed manner, efficiently eliminating air bubbles. The outer cores 265 and 270 may be configured to return to its original configuration when not pressed to the surface of the device (e.g., electronic device 135).

In one embodiment, the mid bar 220 may be curved or straight, and may have a length substantially equivalent to the length of the rollers 210 and 215, thereby joining the two ends of the roller base 205. Additionally, the mid bar 220 may be configured to have a width shorter than a diameter of the outer cores 265 and 270. In this manner, the mid bar 220 provides structural support to the roller apparatus 200 without contacting the film (e.g., film 150) or the device (e.g., electronic device 135) during the application process.

In one embodiment, the splitters 225 and 230 may be located adjacent to the first roller 210. The splitters 225 and 230 may jut inward from the roller base 205 so as not to extend the footprint of the roller apparatus 200. In addition, the splitters 225 and 230 may function to remove the non-adhesive backing from the adhesive portion of the film (e.g., film 150) during an application process. While shown to be two, distinct parallel elements, the splitters 225 and 230 may be joined together (e.g., by extending the splitters 225 and 230 towards one another) and/or may be constructed as one piece. The splitters 225 and 230 may be constructed out of any material with sturdiness sufficient enough to separate and remove the adhesive portion of the film (e.g., film 150) from a non-adhesive backing. In one embodiment, the splitters 225 and 230 may be curved and formed in the shape of a "C" as shown in FIG. 2C. The curvature ("C" shape) of the splitters 225 and 230 may advantageously increase the ease of by which the non-adhesive backing from the adhesive portion of the film (e.g., film 150) is removed. However, other configurations are possible. For example, a "letter opener" configuration where the splitters 225 and 230 include tapered edges may be utilized.

While described in FIG. 2C to have inner cores 255 and 260, certain embodiments of the roller apparatus 200 might not include inner cores 255 and 260. In one embodiment, the roller apparatus 200 may comprise any number of rollers (e.g., one roller—by removing the second roller 215, three rollers—by extending the width of roller base 205 and adding a third roller, etc.) In one embodiment, the roller apparatus 200 may comprises two parts, a roller (e.g., the first roller 210) and a base (e.g., the roller base 205), wherein the base may include an integrated mid bar (e.g., mid bar 220) and a splitter (e.g., splitters 225 and 230).

Figure 2D:
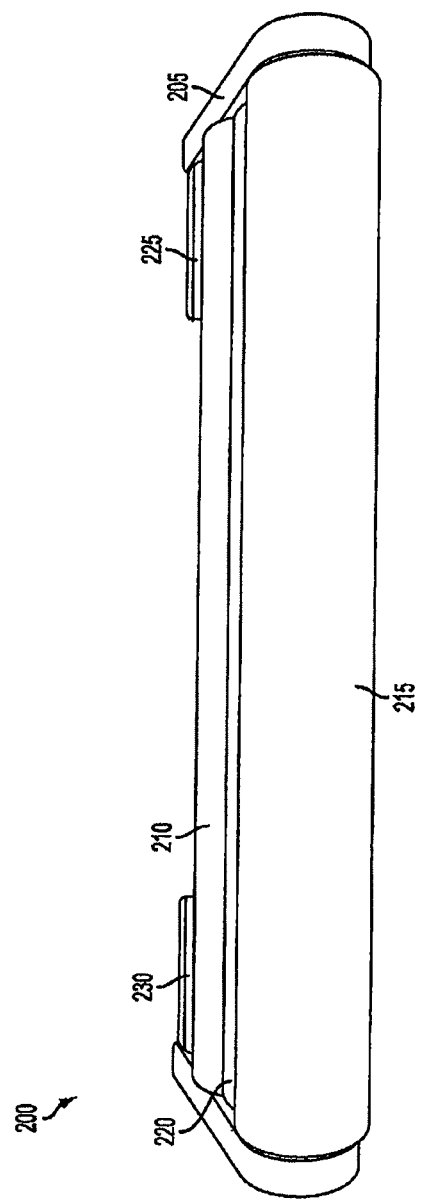
FIG. 2D illustrates a front perspective view of a roller apparatus according to one or more embodiments described herein.
Figure 2F:
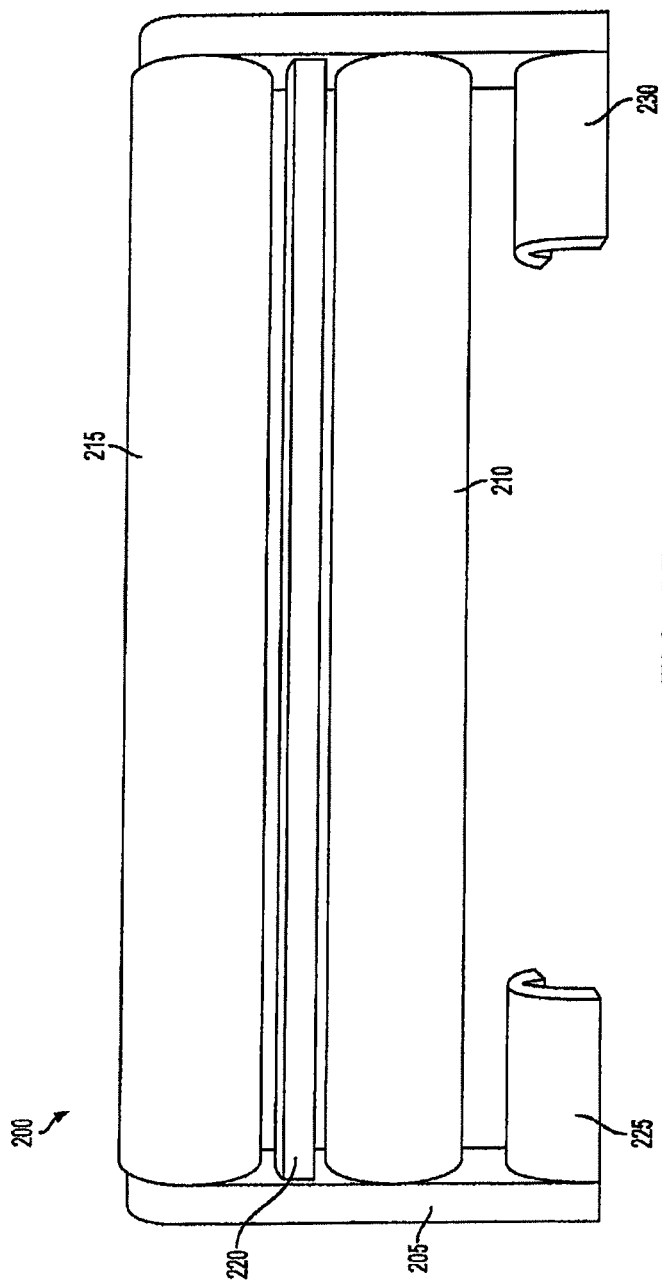
FIG. 2F illustrates a bottom view of a roller apparatus according to one or more embodiments described herein.

FIGS. 2D, 2E and 2F show other various views of one embodiment of the roller apparatus 200.

Figure 2G:
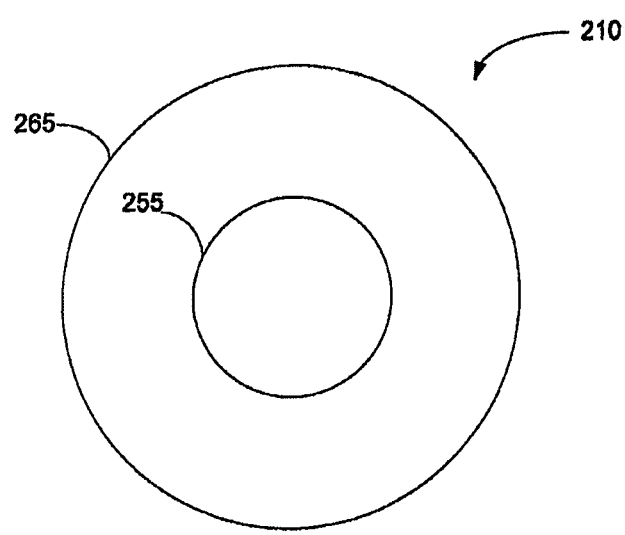
FIG. 2G illustrates a cross-sectional view of the first roller according to one or more embodiments described herein.

FIG. 2G illustrates a cross-sectional view of the first roller 210. All principles of the first roller 210 discussed herein may be equally applicable to the second roller 215. As shown, the outer core 265 may wrap the entirety of the inner core 255. In addition, the inner core 255 may have a substantially smaller diameter than the outer core 265. In one embodiment, the inner core 255 may be constructed out of a rigid material such as metal, wood, a hard plastic, etc. The outer core 265 may be constructed out of a different, non-rigid or semi-rigid material such as a rubber, a soft plastic or a polymer. In one embodiment, the material used to construct the inner core 255 may be the same as the material used to construct the outer core 265. However, in one embodiment, the densities of the material may be different. For example, the materials used to construct the outer core 265 may be less dense and/or have a lower durometer rating. By having a softer outer core 265, the roller apparatus 200 may be able to press the film (e.g., film 150) onto the device (e.g., electronic device 135) without causing surface damage. The softer material of the outer core 265 also helps to more effectively and advantageously remove the air bubbles between the film 150 and the screen of the electronic device 135.

Figure 3A:
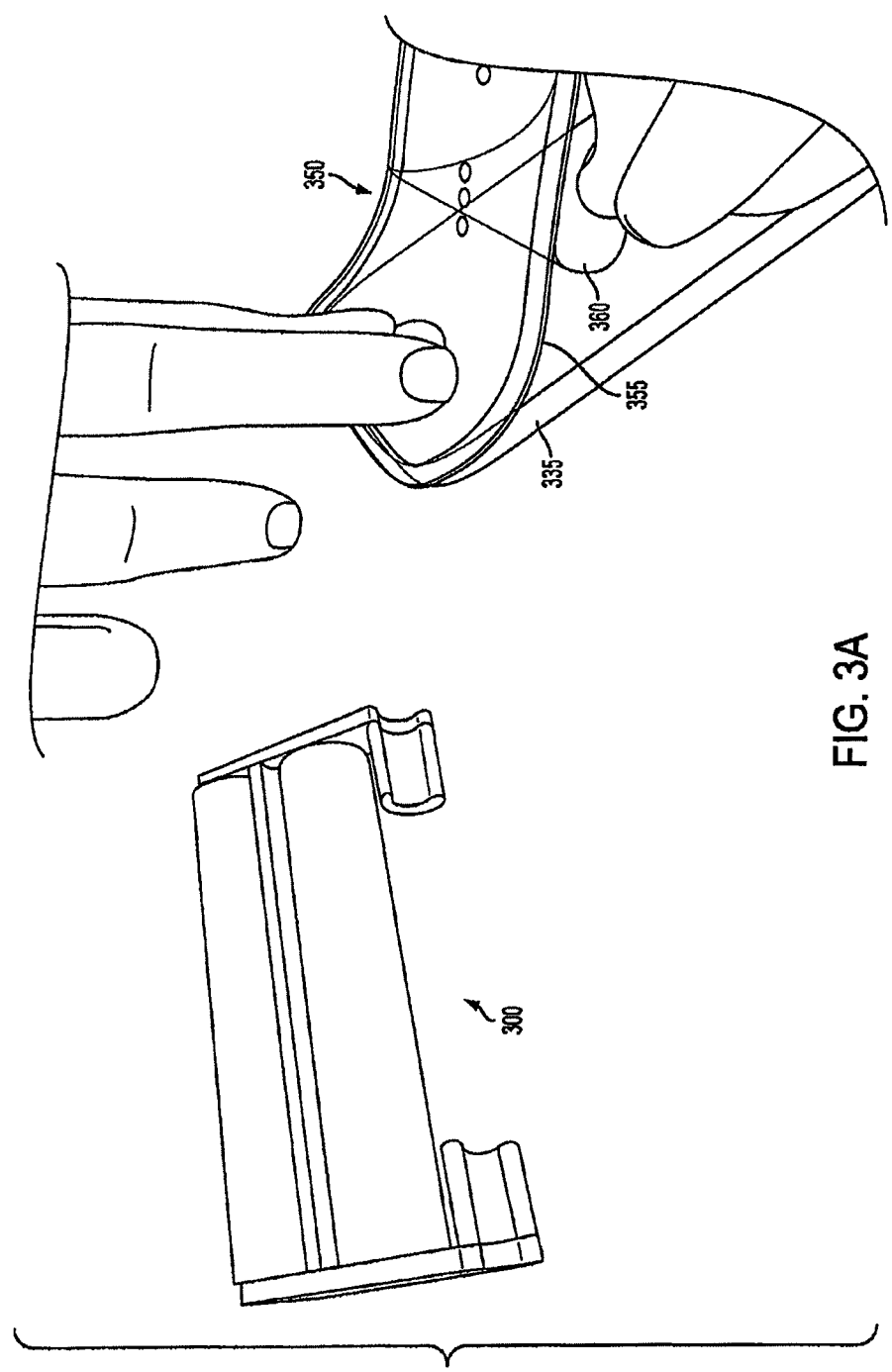
FIG. 3A illustrates a protective material set-up configuration according to one or more embodiments described herein.
Figure 3C:
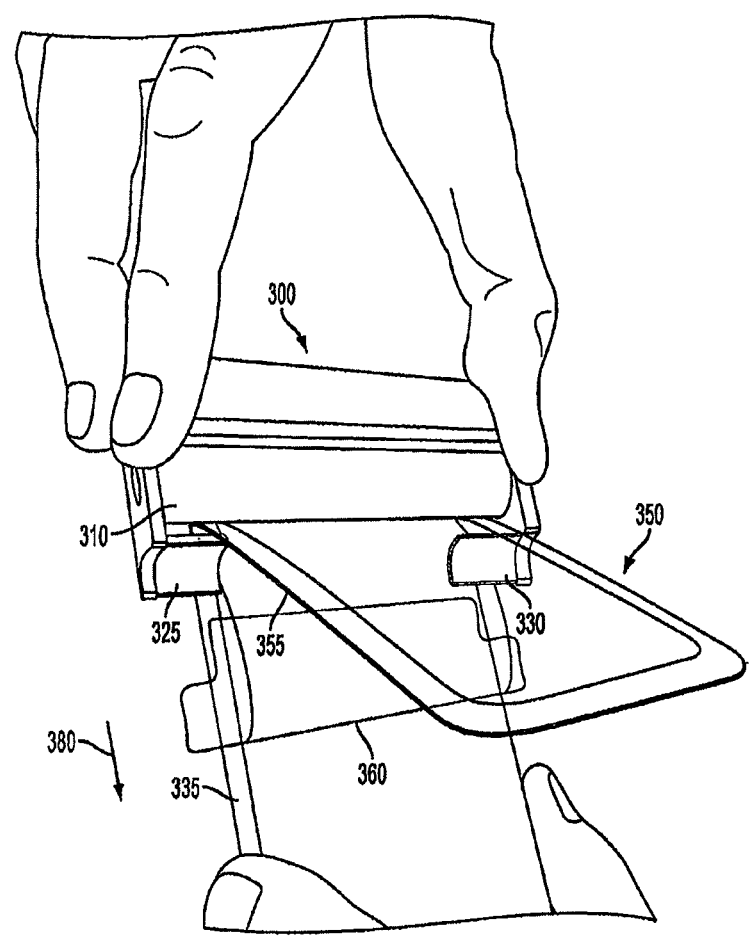
FIG. 3C illustrates a roller apparatus operation configuration according to one or more embodiments described herein.

Turning to FIG. 3A, an operation of the application process will now be discussed. As shown, a user may apply part of an adhesive portion 355 of a film 350 by removing a part of the backing portion 360 of the film 350 and lining up the adhesive portion 355 to a surface (e.g., a screen) of an electronic device 335. The roller apparatus 300 might not be used in this initial set-up step.

Next, as shown in FIG. 3B, the roller apparatus 300 may be configured and placed into position for operation. More particularly, the roller apparatus 300 may be placed on top of the film 300 and electronic device 335 with the splitters 325 and 330 between the adhesive portion 355 and the backing portion 360.

Once the roller apparatus 300 is in position, the user may place one hand on the electronic device 335 (for stability) and use the other hand to push (and roll) the film 350 onto the surface of the electronic device 335 by moving the roller apparatus 300 in a downward direction 380. As the roller apparatus 300 moves in the downward direction 380, one or more rollers 310 and 315 press the adhesive portion 355 of the film 350 onto the electronic device 335 and squeeze out any air bubbles that may be trapped between the film 350 and the electronic device 335. Contemporaneously, the splitters 325 and 330 provide a guide for the film 350 (i.e., "lead the way") and remove the backing portion 360 of the film 350, thereby progressively providing more of the adhesive portion 355 of the film 350 for the rollers 310 and 315 to press down on.

After the roller apparatus 300 is pulled through, across or over the length of the electronic device 335, the adhesive portion 355 of the film 350 may be pressed onto the electronic device 335 and the user does not have to perform any other functions with respect to the surface with the applied adhesive portion 355.

Depending on the design of the film 350, this may conclude the application process. However, in certain embodiments, where the film 350 includes "overhanging" portions, the user may simply press these portions down onto the sides of the electronic device 335 to conclude the application process.

In this manner, the user does not have to use a squeegee, wet solution, etc. to remove the air bubbles or to apply the adhesive portion 355 of the film 350 onto the electronic device 335 and the entire application process may be improved with respect to, for example, cleanliness, ease of use and convenience.

Figure 4A:
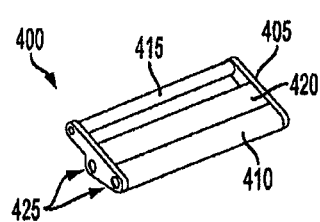
FIG. 4A illustrates a perspective view of a roller apparatus according to one or more embodiments described herein.

FIG. 4A illustrates one embodiment of a roller apparatus 400. The roller apparatus 400 may include an apparatus body 405, a first roller 410 inserted into the apparatus body 405 and held in place by via hole 425 (and its paired hole—not shown). The roller apparatus 400 may also include a second roller (not shown) held in place by hole 430 (and its paired hold—not shown). The roller apparatus 400 may also include a splitter bar 415 and a mid bar 420. The mid bar 420 may be configured to span the length of the first roller 410 and may provide structural support to the roller apparatus 400.

Figure 4B:
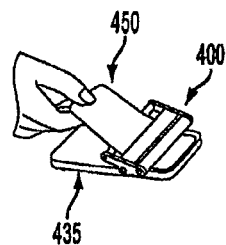
FIG. 4B illustrates a roller apparatus operation configuration according to one or more embodiments described herein.

FIG. 4B illustrates how the roller apparatus 400 may be used to apply a protective material 450 onto a device 435. The splitter bar 415 may be used to split or separate an adhesive portion of a protective material 450 from a non-adhesive backing during the application process. As shown, the roller apparatus 400 may be placed on the device 435 with the protective material 450 wedged between the first roller 410 and the electronic device 435. As the roller apparatus 400 is moved along the surface of the electronic device 435, the splitter bar 415 exposes the adhesive portion of the protective material 450 prior to the first roller 410 pressing the adhesive portion of the protective material 450 down onto the surface of the electronic device 435. In addition, the non-adhesive backing is removed during this process.

Figure 5A:
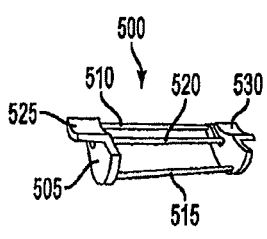
FIG. 5A illustrates a perspective view of a roller apparatus according to one or more embodiments described herein.

FIG. 5A illustrates one embodiment of a roller apparatus 500. The roller apparatus 500 may include a body 505, a first roller 520, a second roller 515, a splitter 510, a first pressing surface 525 and a second pressing surface 530. In one embodiment, the roller apparatus 500 may be constructed as one integrated piece. By integrating the first roller 520 and the second roller 515, along with the splitter 510 into the body 505, additional structural components may be eliminated. In one embodiment, the first roller 520 and the second roller 515 may be rod members that might not rotate. In another embodiment, the first roller 520 and the second roller 515 may be rotatable members.

Figure 5B:
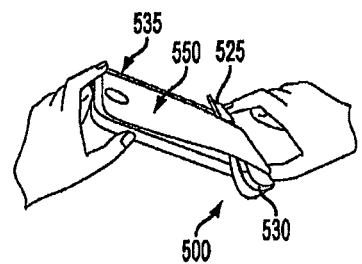
FIG. 5B illustrates a roller apparatus operation configuration according to one or more embodiments described herein.

FIG. 5B illustrates how the roller apparatus 500 may be used to apply a film 550 onto a device 535. As shown, the roller apparatus 500 may separate a top non-adhesive portion of the film 550 from the adhesive bottom portion of the film 550 as the user presses on the first pressing surface 525 and the second pressing surface 530 while moving the roller apparatus 500 along the length of the device 535. During such an operation, the splitter 510 may separate the adhesive and non-adhesive portions of the film 550 while the rollers 520 and 515 may apply the adhesive portions of the film 550 to the surface of the device 535. In this embodiment, the device 535 may be sandwiched or be located between the first roller 520 and the second roller 515. The first roller 520 may contact the film 550 (as shown in FIG. 5B) on a first surface (e.g., a screen) of the device 535 while the second roller 515 may contact a second surface (e.g., a backing) of the device 535.

FIG. 6A illustrates a roller apparatus 600, an electronic device 635, a film 650 and an optional film tab 695. The roller apparatus 600 may be used to apply the film 650 to a surface of the electronic device 635. In one embodiment, the film tab 695 may be used to improve the ease of applying the film 650 as further discussed below.

Figure 6B:
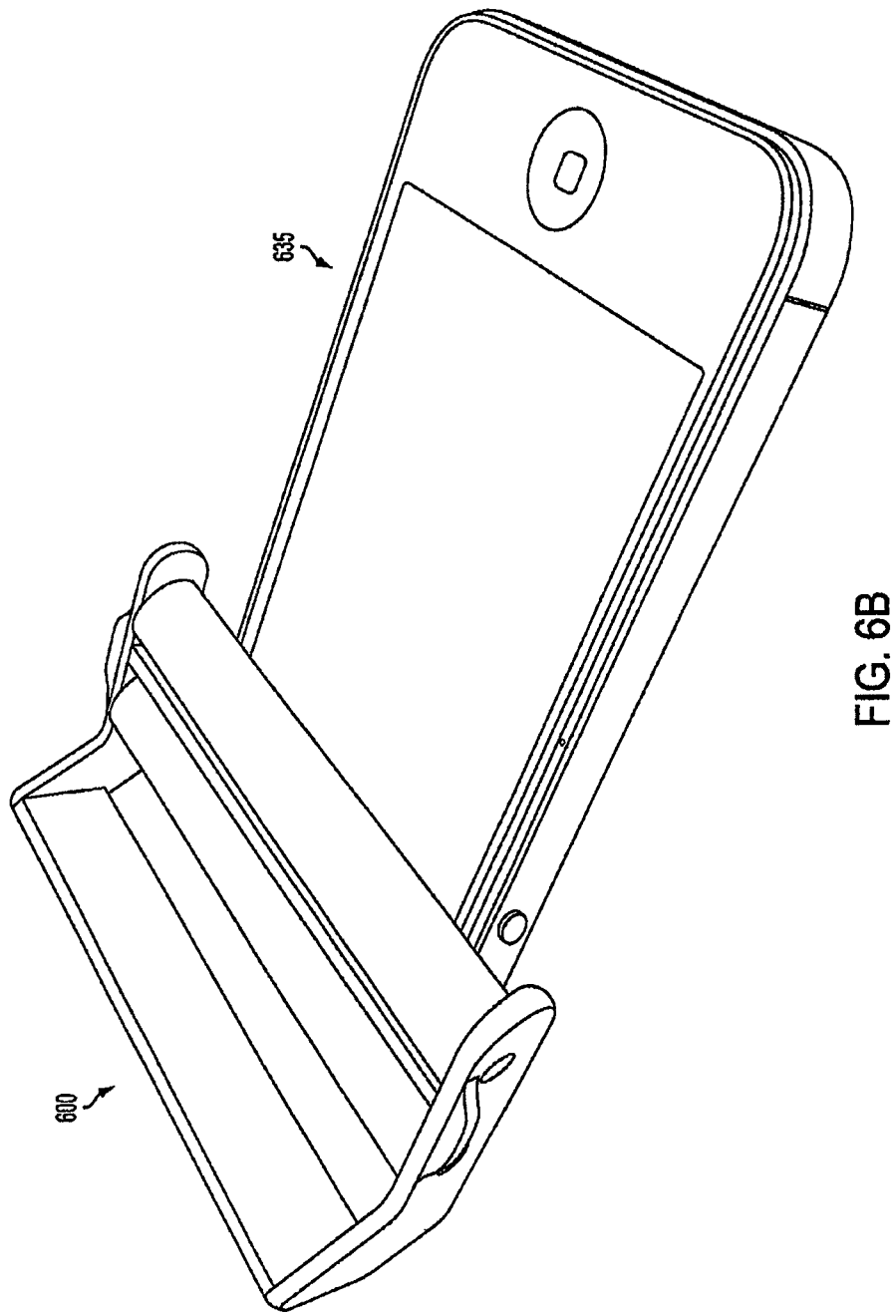
FIG. 6B illustrates a roller apparatus with an integrated stand in a first operation configuration according to one or more embodiments described herein.

FIG. 6B illustrates one embodiment of how the roller apparatus 600 may appear when mounted on the electronic device 635, for example, during a film application process. As shown, the roller apparatus 600 may have a width wider than the width of the electronic device 635. In this manner, the roller apparatus 600 may be configured to apply films of varying sizes onto devices of varying sizes (e.g., a tablet PC). In addition, the roller apparatus 600 may be configured to apply the film 650 to a device with a curved surface (not shown).

Figure 6C:
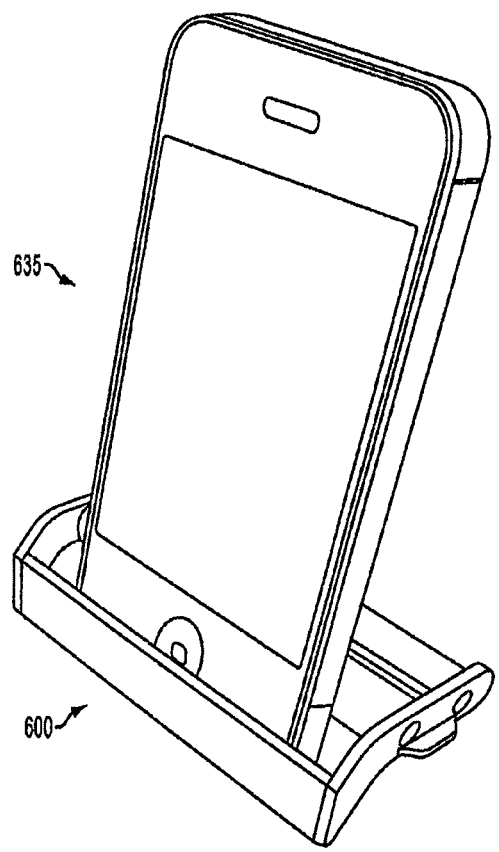
FIG. 6C illustrates a roller apparatus with an integrated stand in a second operation configuration according to one or more embodiments described herein.

However, distinct from the first operation configuration, the roller apparatus 600 may be utilized in a second operation configuration to hold, secure, prop or otherwise position the electronic device 635 such that it may be easier for a user to view and/or use the electronic device 635. For instance, the roller apparatus 600 may be flipped over to a second operation configuration and rest on a flat surface and the like to prop up the electronic device 635 and improve viewing angles of the electronic device 635 to a user. In this manner, the roller apparatus 600 may have continued utility even after a film (e.g., film 650) is applied by the roller apparatus 600 to the electronic device 635. As shown in FIG. 6C, the electronic device 635 sits in an upright manner within a cavity of the roller apparatus 600. In one embodiment, the cavity is defined to be a space between a front bar and a first roller.

Figure 6D:
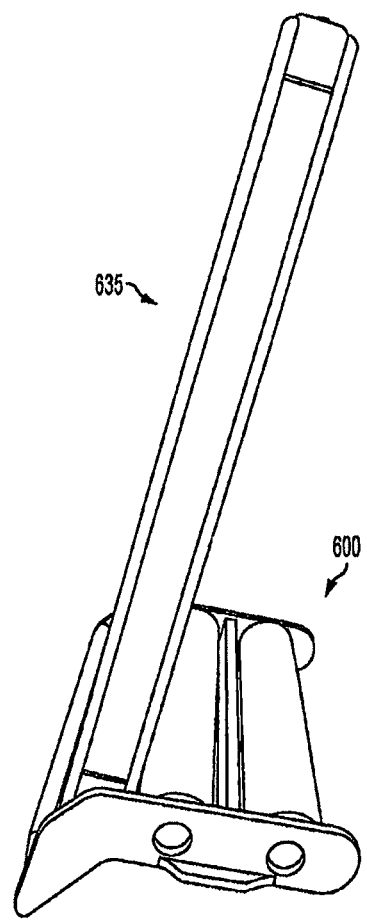
FIG. 6D illustrates a side view of the roller apparatus of FIG. 6C according to one or more embodiments described herein.

FIG. 6D illustrates a side view of the roller apparatus 600 with the electronic device 635 held in an upright manner. As shown in FIG. 6D, the electronic device 635 may sit angled while still being upright. By varying the width of the cavity (i.e., distance between the front bar and the first roller), the positioning of the stand edge and the like, the viewing angle may be adjusted between 90 degrees and 135 degrees. For example, as shown in FIG. 6D, the electronic device 635 may be held at an angle of 120 degrees as measured between a table surface and a viewing surface of the electronic device 635.

Figure 6E:
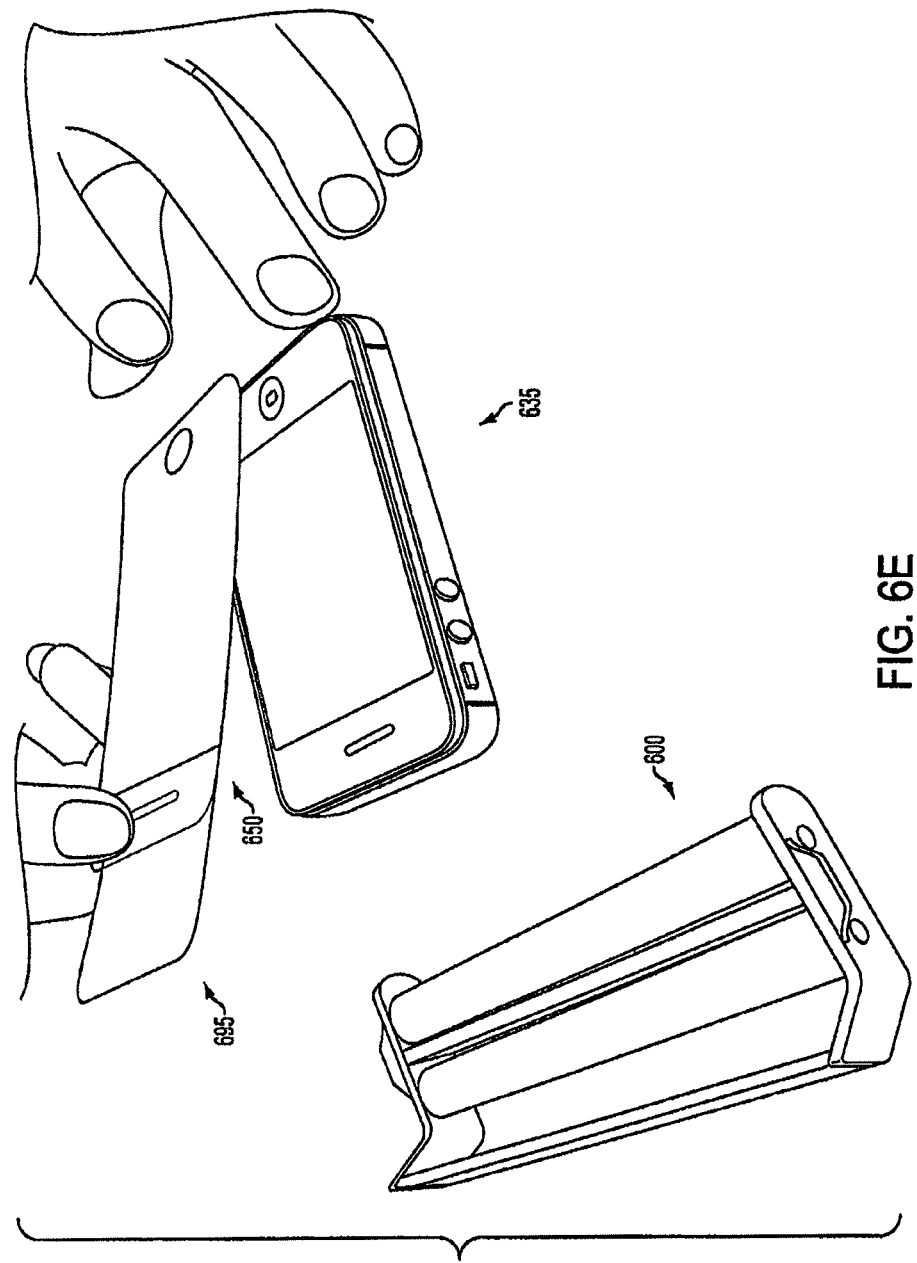
FIG. 6E illustrates a protective material set-up configuration according to one or more embodiments described herein.
Figure 6G:
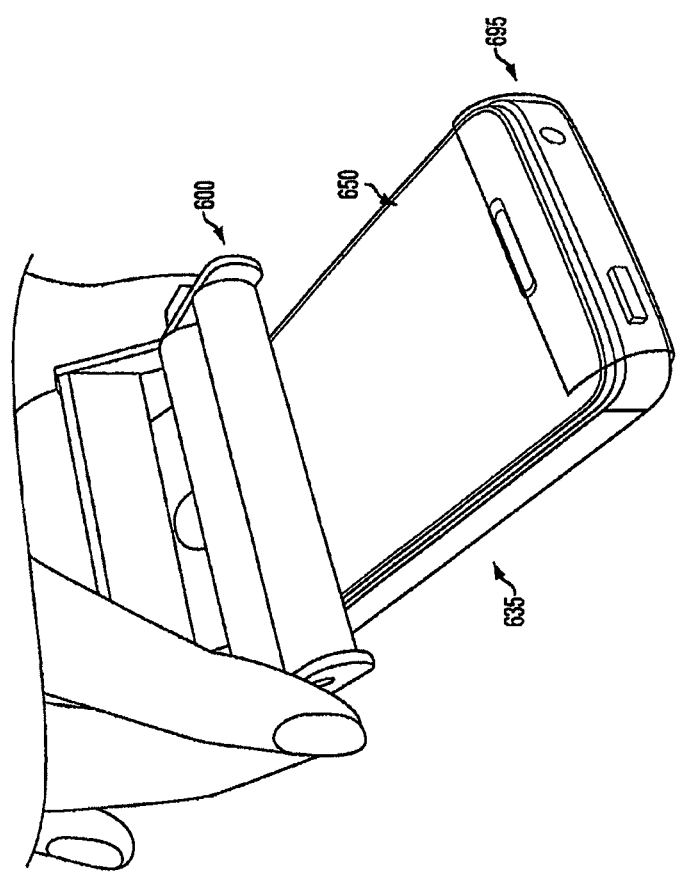
FIG. 6G illustrates a roller apparatus operation configuration according to one or more embodiments described herein.

FIGS. 6E-6G illustrate one example of how the roller apparatus 600 may be utilized to apply the film 650 onto a surface of the electronic device 635. As shown in FIG. 6E, the film tab 695 may be applied (and may adhere) to the film 650 and held in a preliminary application position by a user's hand near the surface of the electronic device 635. The film tab 695 may function to aid the user in lining up the film 650 with the electronic device 635 and simplifying the application process since the user may be able to handle a portion of the film tab 695 without worrying about whether the film 650 will adhere to the user's fingers during the application process. The roller apparatus 600 might not be engaged at this stage. In one embodiment, the film tab 695 may be pre-installed on the film 650 for the consumer's convenience.

Next, as shown by FIG. 6F, a portion of the adhesive portion 655 of the film 650 has been separated from a portion of the non-adhesive film backing 660, and has been pressed onto the surface of the electronic device 635. At this point of the film application process, the user may retrieve the roller apparatus 600. The user may then utilize the roller apparatus 600 and press the adhesive portion 655 of the film 650 to the surface of the electronic device 635 with one hand while moving the roller apparatus 600 in a length-wise direction. Immediately proceeding the moment when the roller apparatus 600 presses one section of the adhesive portion 655 of the film 650 onto the surface of the electronic device 635 to remove any air bubbles, the user may remove a corresponding section of the non-adhesive film backing 660 with the other hand in preparation. In this manner, the adhesive portion 655 of the film 650 may be applied to the surface of the electronic device 635. In addition, any air bubbles between the adhesive portion 655 and the surface of the electronic device 635 resulting from the application process may be removed or squeezed out by the roller apparatus 600 being pressed and maneuvered.

FIG. 6G illustrates an example of how the user may utilize the roller apparatus 600 to apply the film 650 to the surface of the electronic device 635 while removing any air bubbles. Once the adhesive portion 655 of the film 650 is applied to the surface of the electronic device 635, the film tab 695 may be removed by peeling (not shown) it from the film 650. In this quick and efficient manner, the application process may be completed.

Figure 7A:
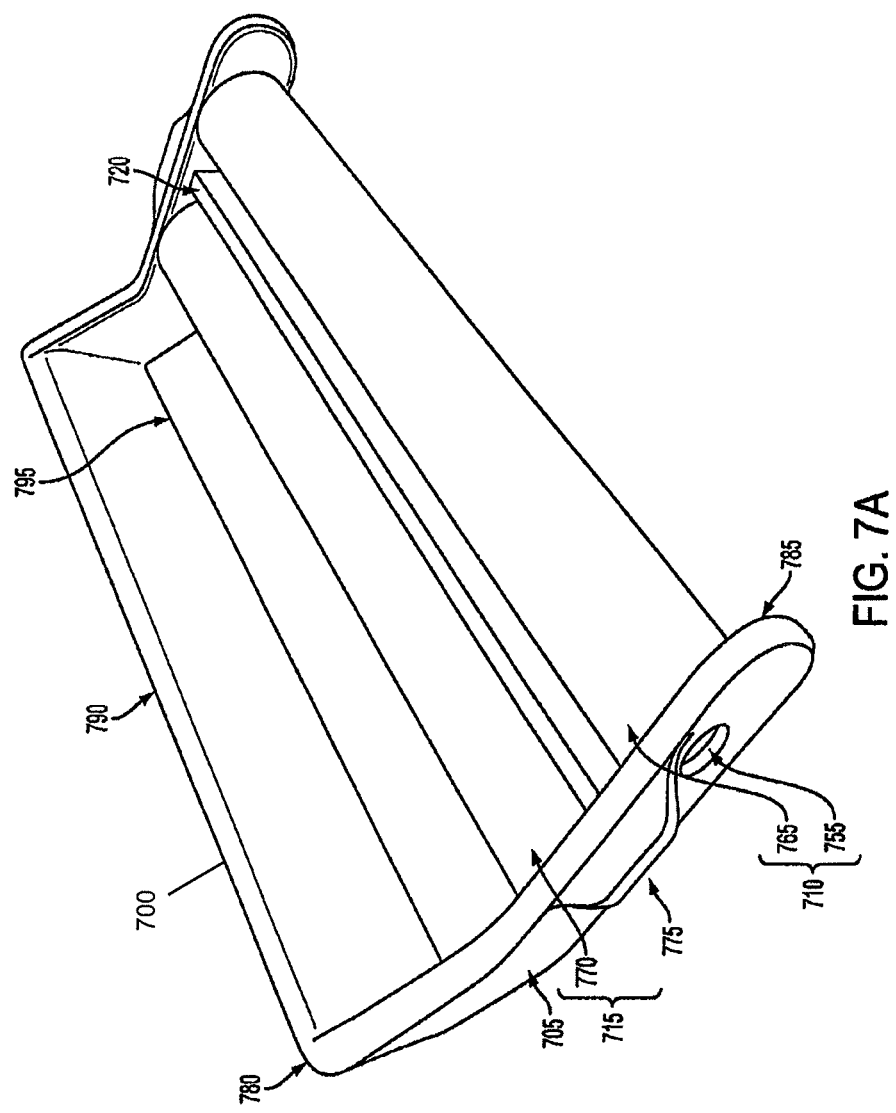
FIG. 7A illustrates a perspective top view of a roller apparatus with an integrated stand according to one or more embodiments described herein.
Figure 7B:
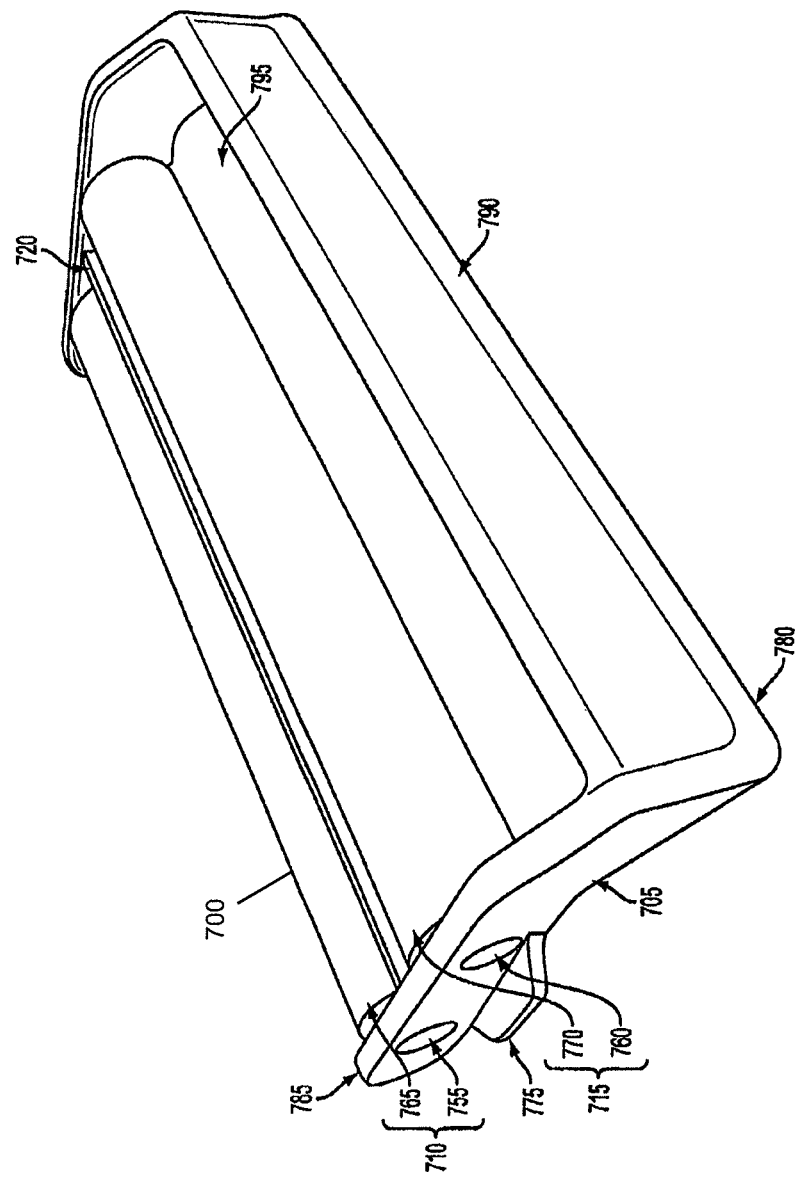
FIG. 7B illustrates a perspective bottom view of a roller apparatus with an integrated stand according to one or more embodiments described herein.

FIG. 7A illustrates an embodiment of a roller apparatus 700 with an integrated stand. The roller apparatus 700 may be an embodiment of the roller apparatus 600 of FIG. 6. As shown, the roller apparatus 700 may be in a first operational position with rollers 710 and 715 in contact with the flat surface beneath it (e.g., table). The roller apparatus 700 may include a body or carriage 705 configured to provide structural support for the rollers 710 and 715. The carriage 705 may include attached or integrated handle portions 775, a mid bar 720 and two contact edges 780 and 785 separated by the rollers 710 and 715. The rollers 710 and 715 may include inner and outer cores 755, 760 (shown in FIGS. 7B and 7C), 765 and 770). The carriage 705 may also include a device insertion portion 795 for insertion of the electronic device (e.g., electronic device 635). However, the device insertion portion 795 may be intended for usage when the roller apparatus 700 is flipped over, as shown in FIG. 7B.

In one embodiment, the handle portions 775 may be configured to allow a user to press down on the handle portions 775 to transfer pressure onto the rollers 710 and 715 during a protective film application process. When the user presses down on the handle portions 775 and maneuvers the roller apparatus 700 along the length of a protective film (e.g., film 650), a force may be transferred to the rollers 710 and 715, which in turn applies a pressure to the protective film (e.g., film 650) resulting in adherence of the film (e.g., film 650) to a surface (e.g., a screen) of the electronic device (e.g., electronic device 635). In addition, any air bubbles may be eliminated due to the pressure applied by the rollers 710 and 715.

The carriage 705 may be constructed out of a rigid material such as a plastic, a metal, a wood and the like. In addition, the carriage 705 may be sized to be easily graspable and manipulated by a user's hand. The carriage 705 may be configured to hold the first roller 710 in place and allow the first roller 710 to "roll" or rotate about a longitudinal axis created by the carriage 705. In one example, the carriage 705 may be structured to include a rod member (not shown) spanning the entire length of the first roller 710, thereby forming an axis for the first roller 710 to rotate about. In another example, the carriage 705 may include two insertion portions opposite each other for inserting a rotational member of a first roller 710.

The first roller 710 may be configured to apply physical pressure on a film (e.g., film 650) in operation. The second roller 715 may be a redundant pressure applicator and may be substantially the same size as, and parallel to the first roller 710. The first roller 710 and the second roller 715 may be separated by a mid bar 720. The mid bar 720 may connect the two ends of the carriage 705 and provide the entire roller apparatus 700 with stability. In addition, gaps between the mid bar 720 and the rollers 710 and 715 may allow the rollers 710 and 715 to rotate freely without contacting the mid bar 720.

In one embodiment, the roller apparatus 700 may be configured to function as a film applicator for phone-sized devices and may have a length of 1-2 inches, a width of 2-4 inches, and a height of 0.5-1 inches. In one embodiment, the roller apparatus 700 may be configured to function as a film applicator for tablet-sized devices and may have a length of 1-5 inches, a width of 8-12 inches, and a height of 0.5-2 inches. Other dimensions are also possible depending on the size of the device to be protected and/or the size of the film to be applied.

In one embodiment, the mid bar 720 may be curved or straight, and may have a length substantially equivalent to the length of the rollers 710 and 715, thereby joining the two ends of the carriage 705. Additionally, the mid bar 720 may be configured have a width shorter than a diameter of the outer cores 765 and 770. In this manner, the mid bar 720 provides structural support to the roller apparatus 700 without contacting the film (e.g., film 750) or the device (e.g., electronic device 735) during the film application process.

In one embodiment, the contact edge 780 may be raised and further away from the flat surface (e.g., the table) than, for example, the rollers 710 and 715 when the roller apparatus 700 is positioned as shown in FIG. 7A.

As shown in FIG. 7B, when the roller apparatus 700 is flipped over, the contact edge 780 raises the rollers 710 and 715 off a flat surface (e.g., a table) and also orients the device insertion portion 795 such that insertion and propping of the electronic device (e.g., electronic device 635) is possible. As more clearly shown in FIG. 7C, when the roller apparatus 700 is in this position, the second roller 715 may be raised off the table and may allow for the electronic device (e.g., electronic device 635) to rest on an outer core 770 of the second roller 715. More particularly, the electronic device (e.g., the electronic device 635) may be contacted on a first surface by the second roller 715 and contacted on a second surface by the stand portion 790 as it sits within the insertion portion 795. In one embodiment, the stand portion 790 may be a flat panel having a length substantially similar to a length of the first roller 710 and the second roller 715. As shown, the stand portion 790 may be offset from the first roller 710 and the second roller 715. In other words, the stand portion 790 may be separated from the first roller 710 and the second roller 715 by a gap constituting the device insertion portion 795.

FIG. 7C is a side perspective view of the roller apparatus 700 in its second operation configuration. As shown, the rollers 710 and 715 may include the inner cores 755 and 760, respectively. In addition, the rollers 710 and 715 may include the outer cores 765 and 770, respectively. In one embodiment, the inner cores 755 and 760 may be constructed out of the same material (e.g., a rigid material such as metal, wood, and a hard plastic). Similarly, the outer cores 765 and 770 may be constructed out of the same material (e.g., rubber, a soft plastic, an encapsulated gel, etc.) or a softer material. In one embodiment, the material used to construct the inner cores 755 and 760 may be the same as the material used to construct the outer cores 765 and 770. However, the densities of the material may be different. For example, the materials used to construct the outer cores 765 and 770 may be less dense and/or have a lower durometer rating. By having softer outer cores 765 and 770, the roller apparatus 700 may be able to press the film onto the device (e.g., electronic device 635) without damaging the surface. In one embodiment, the outer cores 765 and 770 may be configured to "flatten" at the point of contact and thereby providing pressure in a more uniform and distributed manner, efficiently eliminating air bubbles. The outer cores 765 and 770 may be configured to return to its original configuration when not pressed to the surface of the device (e.g., electronic device 635).

Figure 7D:
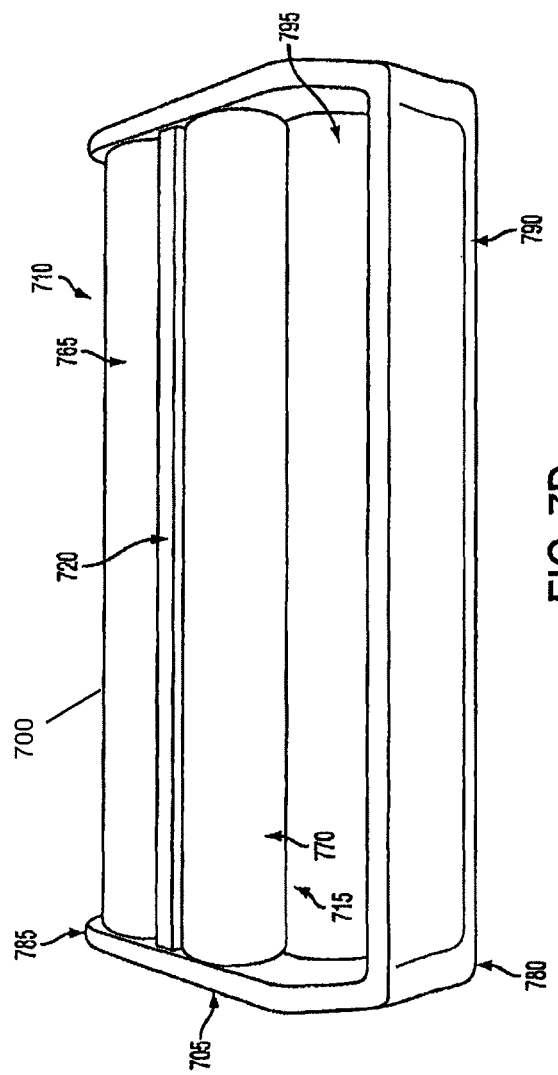
FIG. 7D illustrates a perspective rear view of a roller apparatus with an integrated stand according to one or more embodiments described herein.
Figure 7E:
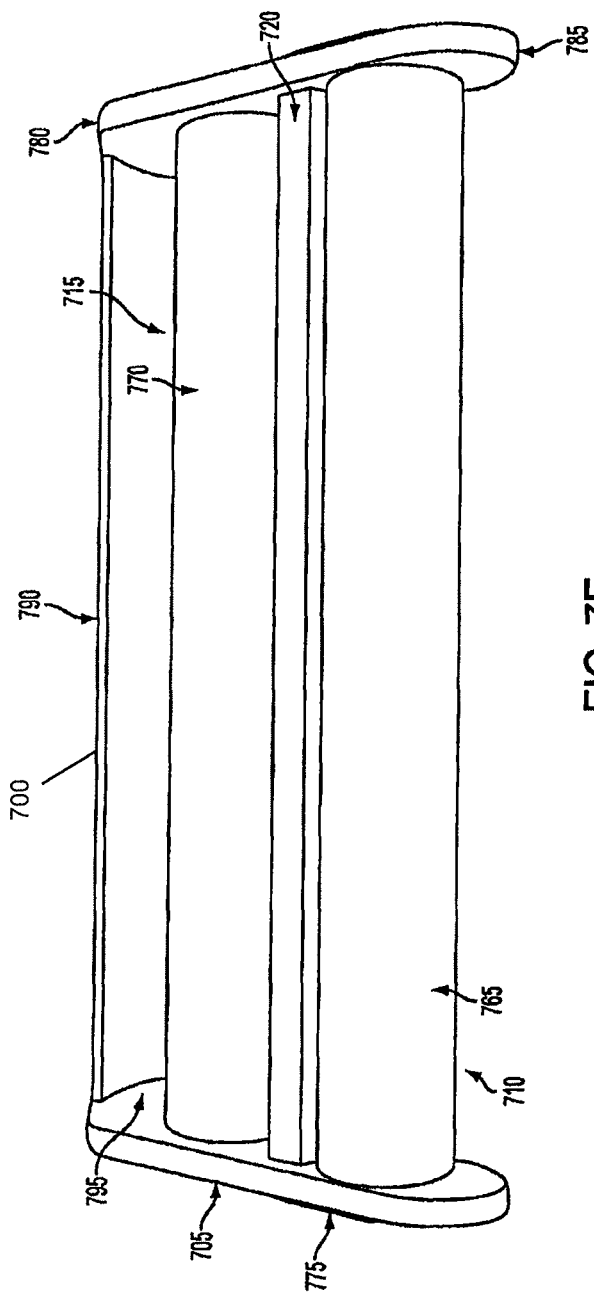
FIG. 7E illustrates a perspective front view of a roller apparatus with an integrated stand according to one or more embodiments described herein.

FIG. 7D and FIG. 7E show other various views of one embodiment of the roller apparatus 700.

Figure 8A:
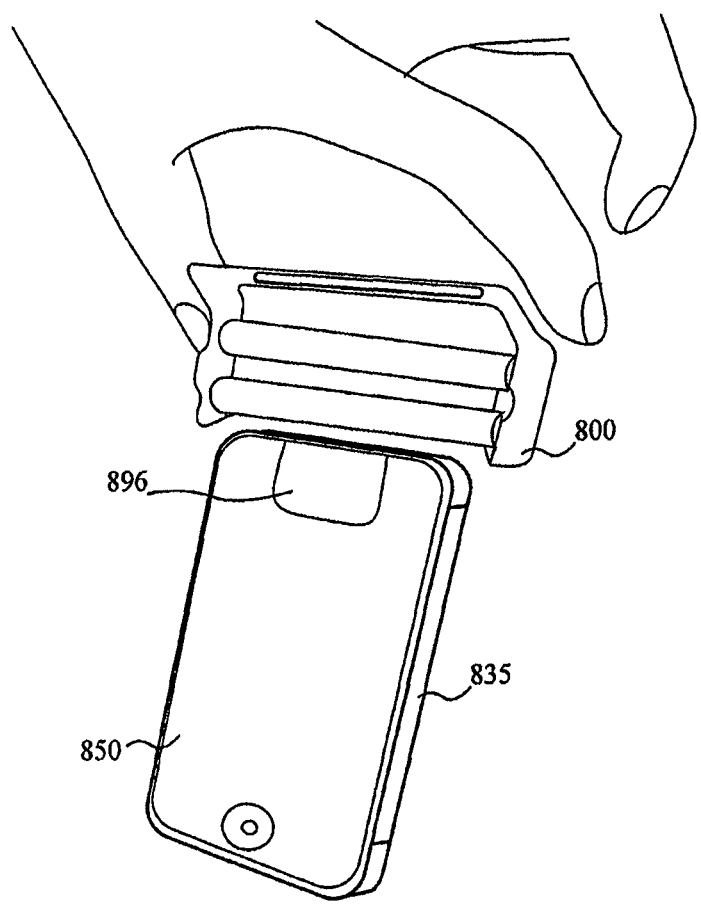
FIG. 8A illustrates a roller apparatus with an integrated stand in a first operation configuration according to one or more embodiments described herein.

FIG. 8A illustrates a roller apparatus 800 with an integrated stand in a first operation configuration according to another embodiment of the present invention. Generally, the roller apparatus 800 may function similarly to roller apparatus 600 and 700. More particularly, FIG. 8A illustrates the roller apparatus 800 in position to perform a film application process to apply a film 850 to the top surface of an electronic device 835. As shown, the roller apparatus 800 may have a width wider than the width of the electronic device 835. In this manner, the roller apparatus 800 may be configured to apply films of varying sizes onto devices of varying sizes (e.g., a tablet PC). In addition, the roller apparatus 800 may be configured to apply the film 850 to a device with a curved surface (not shown). Here, in preparing to apply the film 850 to the electronic device 835, the film 850 may be placed on the surface of the electronic device 835 with a film tab 896 positioned between the film 850 and the surface of the electronic device 835 to be protected. Further details of the structure of the roller apparatus 800 and the film application process are discussed below with respect to FIGS. 8C-8G.

Figure 8B:
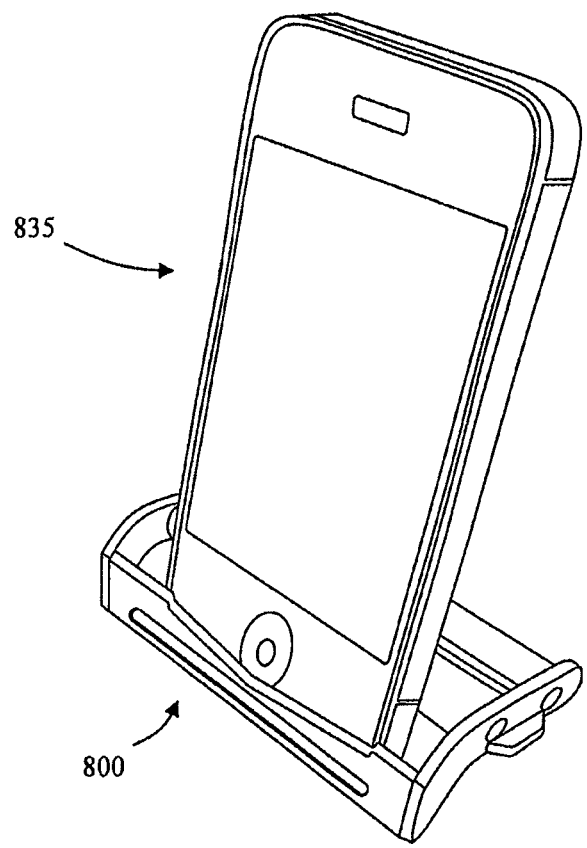
FIG. 8B illustrates a roller apparatus with an integrated stand in a second operation configuration according to one or more embodiments described herein.

However, as shown in FIG. 8B, distinct from the first operation configuration, the roller apparatus 800 may be utilized in a second operation configuration to hold, secure, prop or otherwise position the electronic device 835 such that it may be easier for a user to view and/or use the electronic device 835. For instance, the roller apparatus 800 may be flipped over to a second operation configuration and rest on a flat surface and the like to prop up the electronic device 835 and improve viewing angles of the electronic device 835 to a user. In this manner, the roller apparatus 800 may have continued utility even after a film (e.g., film 850) is applied by the roller apparatus 800 to the electronic device 835. As shown in FIG. 8B, the electronic device 835 sits in an upright manner within a cavity of the roller apparatus 800. In one embodiment, the cavity is defined to be a space or opening within the roller apparatus 800.

Figure 8C:
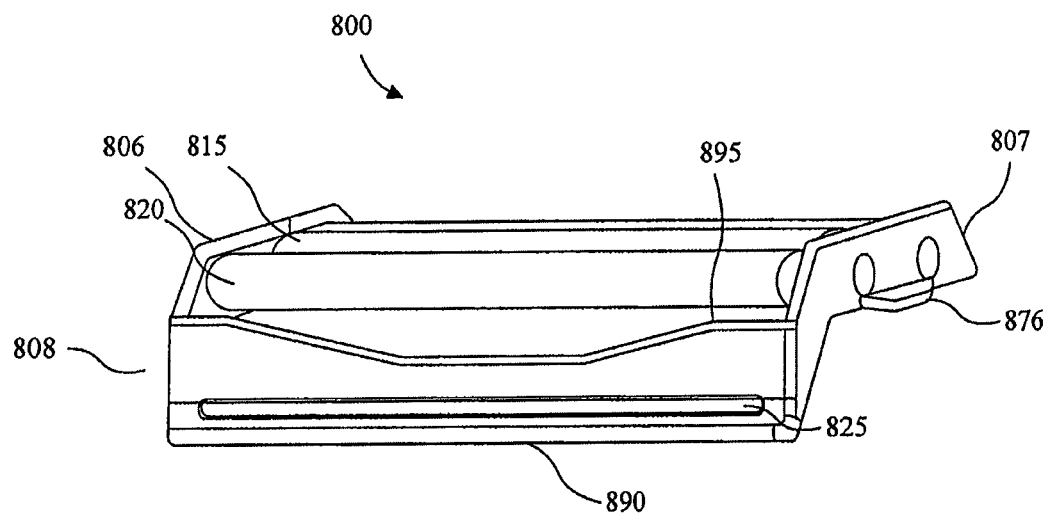
FIG. 8C illustrates a perspective bottom view of a roller apparatus with an integrated stand according to one or more embodiments described herein.

FIG. 8C illustrates a perspective bottom view of the roller apparatus 800 with an integrated stand. One main difference between the roller apparatus 800 and the roller apparatus 600 and 700 is that the former further includes a slit or slot 825 for receiving and guiding the film (e.g., film 850 shown in FIG. 8B) during the film application process. As shown, the roller apparatus 800 may include a body 805 comprising a first side panel 806, a second side panel 807 integrated with a stand portion 808 having the slit 825. The first side panel 806 and second side panel 807 may be substantially parallel and include holes or openings to hold therebetween a first roller 815 and a second roller 820 and to allow the rollers 815 and 820 to rotate during usage to apply the film. The first roller 815 and the second roller 820 may be separated by a mid portion. The first roller 815 and the second roller 820 may be similar to the other first and second rollers described herein (e.g., first and second rollers 715 and 720). The side panels 806 and 807 may each integrate a pressing portion (e.g., pressing portion 876—the other pressing portion is hidden from view) to allow the user to press on and thereby exert pressure on the rollers 815 and 820 during the film application process. The roller apparatus 800 may also include a contact edge 890 and a non-contact edge 895 to define how the roller apparatus 800 is positioned to be operable in the second operation configuration. The contact edge 890 is operatively configured to contact a table surface and position the roller apparatus 800 to be able to receive and hold upright the electronic device 835. As is shown, the non-contact edge 895 might not contact either the electronic device or the table surface in the second operation configuration.

Figure 8D:
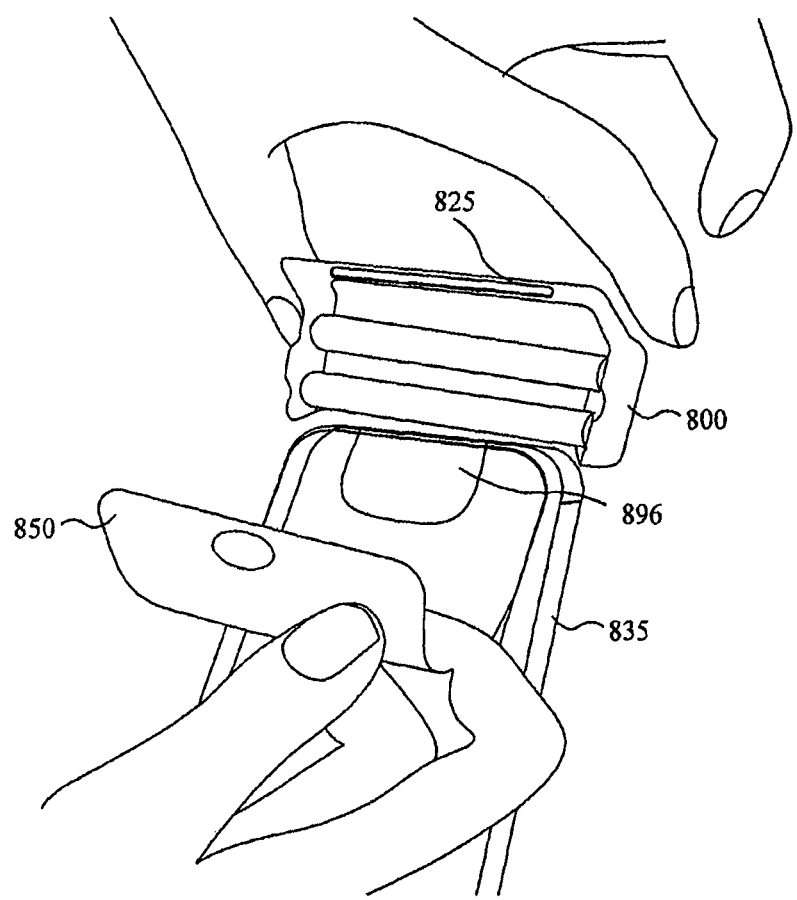
FIG. 8D illustrates a roller apparatus operation configuration according to one or more embodiments described herein.

The operational configurations and the structure of the roller apparatus 800 having been described, attention will now be turned to the film application process. As shown in FIG. 8D, the user may position the film 850 having the backing still attached substantially in the position that the film 850 would be in after application. Here, the film 850 may be temporarily adhered to the electronic device 835 via a film tab 896. When positioned as shown, the user may bend the non-adhered portion of the film and move it towards the slit 825 of the roller apparatus 800.

Figure 8E:
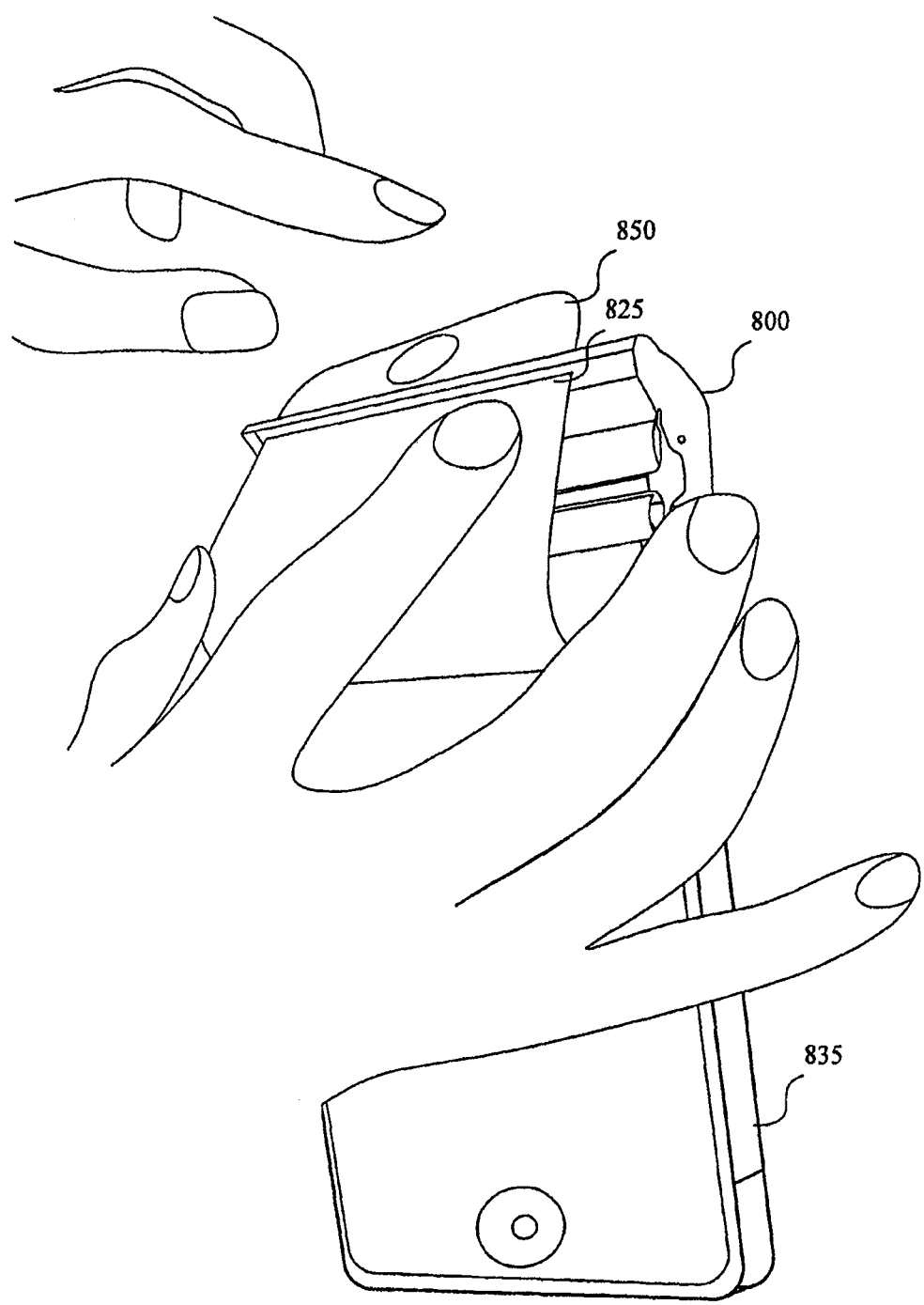
FIG. 8E illustrates a roller apparatus operation configuration according to one or more embodiments described herein.
Figure 8F:
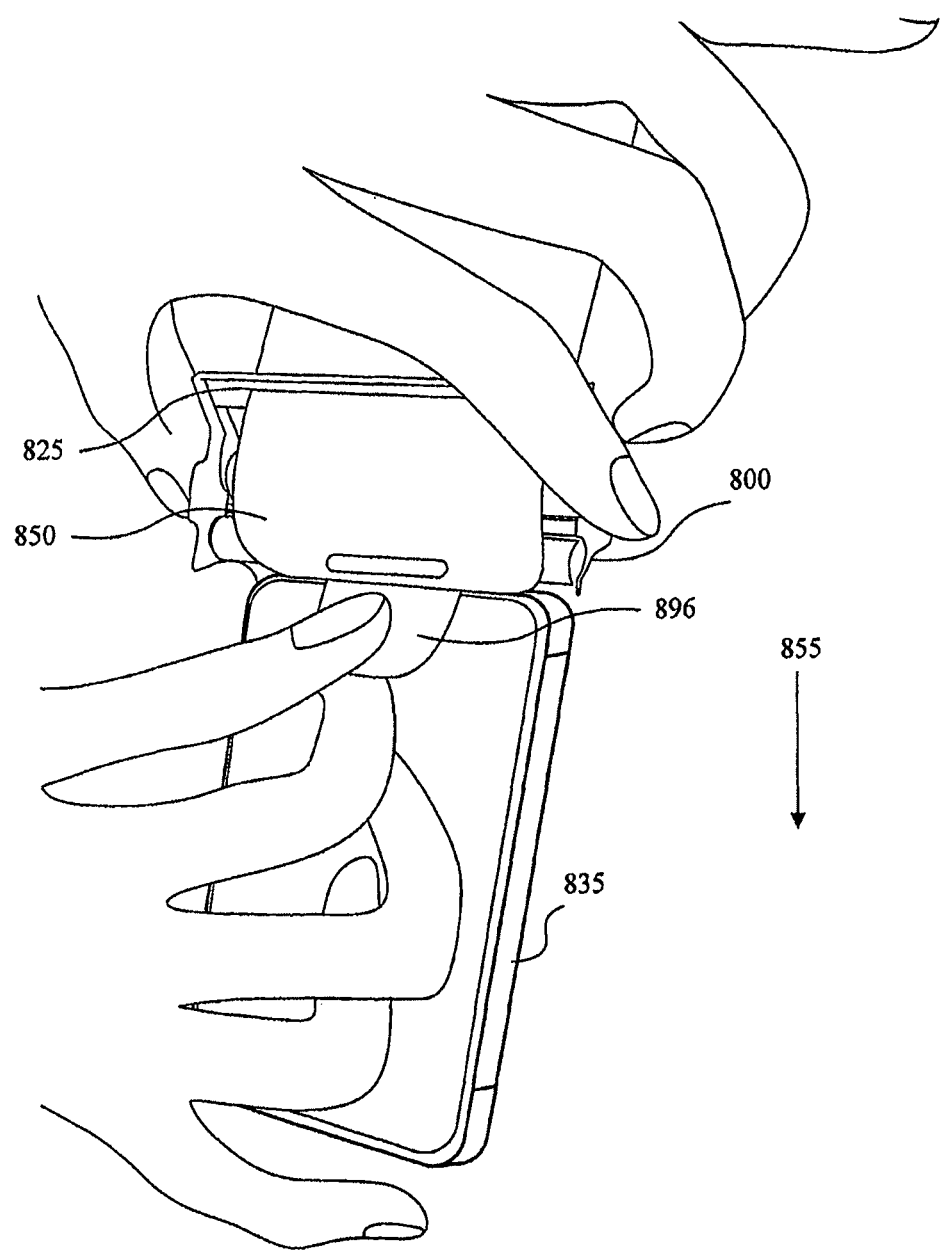
FIG. 8F illustrates a roller apparatus operation configuration according to one or more embodiments described herein.
Figure 8G:
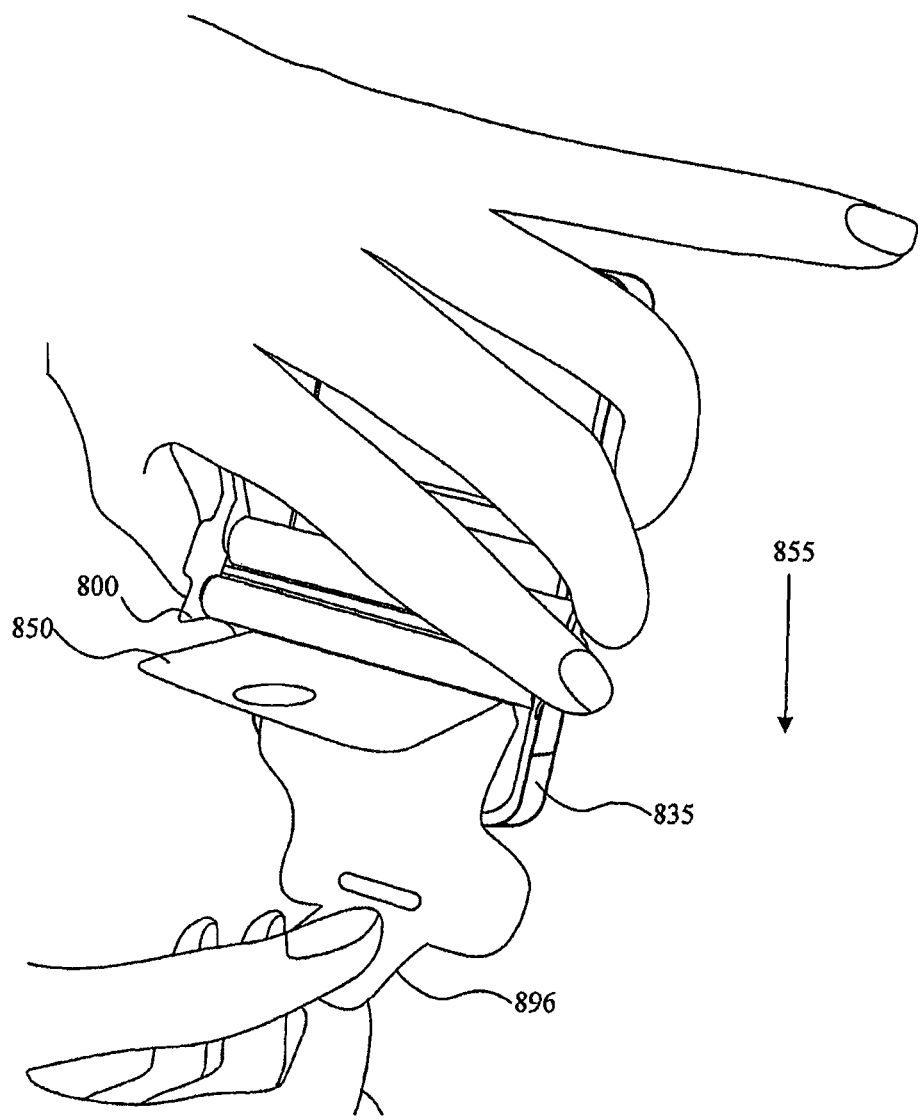
FIG. 8G illustrates a roller apparatus operation configuration according to one or more embodiments described herein.

FIG. 8E illustrates the film 850 as inserted through the slit 825. As shown in FIG. 8F, as the film 835 is inserted through the slit 825, the film tab 896 becomes exposed to the user. With one hand holding the roller apparatus 800, the user may use his or her other hand to begin pulling the film tab 896 in the direction shown by arrow 855 and separate the protective layer of the film from the backing. As shown in FIG. 8G, as the user continues to pull the film tab 896 with one hand and exposes the protective layer of the film, the user may begin to move the roller apparatus 800 with the other hand also in the direction shown by arrow 855 to press the exposed portion of the protective layer to the electronic device 835. In this manner, the user may progressively apply the protective layer to the electronic device 835 until the protective layer is completely separated from the backing and completely applied to the electronic device 835. Optionally, the user may use the roller apparatus 800 to further redundantly press the protective layer to ensure a thorough application. As discussed above, even after the completion of the application process, the roller apparatus 800 may still retain utility as a device stand (e.g., described as the second operational configuration).

Any of the roller apparatus as discussed herein may be used to apply a protective film onto the surface of a mobile communication device. However, to further assist the user in applying the protective film, a roller apparatus guide 900 may be used in conjunction with a roller apparatus (e.g., roller apparatus 800).

Figure 9A:
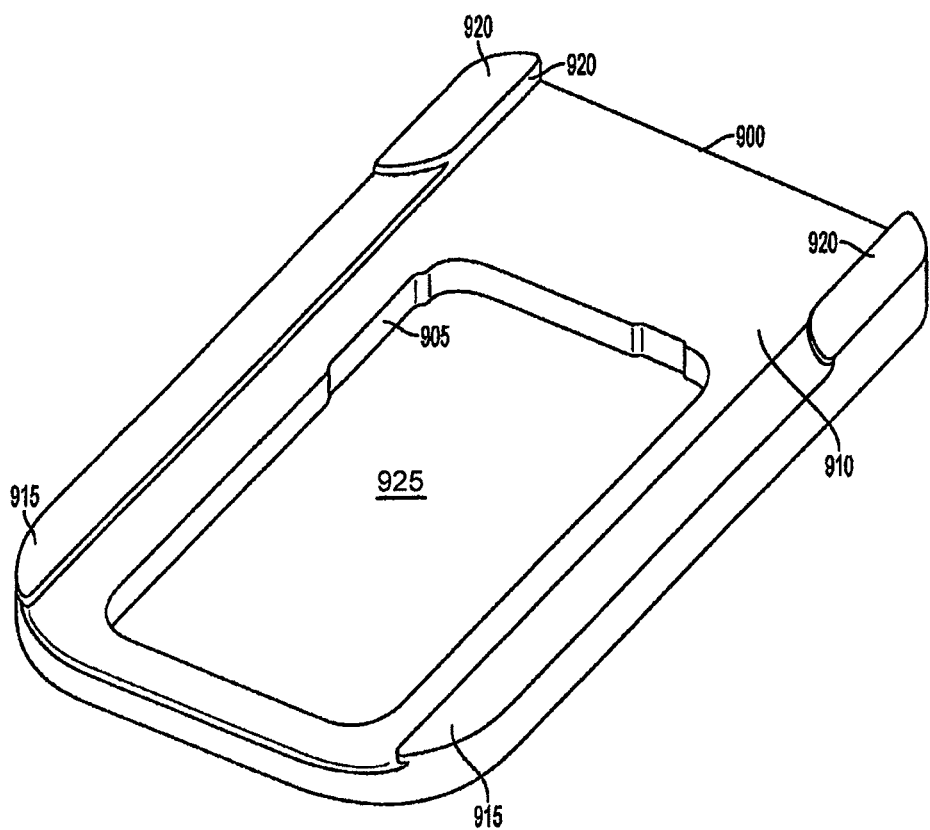
FIG. 9A illustrates a roller guiding apparatus according to one or more embodiments described herein.

As illustrated in FIG. 9A, the roller apparatus guide 900 may be constructed out of materials such as polycarbonate, metal, wood (e.g., a cardboard or thick paper) or any combinations thereof. The roller apparatus guide 900 may be a substantially rectangular block having three or more portions including an inner wall 905 defining a cavity 925 used to receive or mount a mobile communication device, a roller supporting surface 910 configured to be flush with a mounted mobile communication device and a set of roller guiding rails 915 which may be parallel to one another and raised above the roller supporting surface 910. In addition, the roller apparatus guide 900 may include pressing portions 920 to assist the user when applying the protective film. As shown, the roller apparatus guide 900 may be configured to fit a particular mobile communication device with a distinct length, width and height. However, one of ordinary skill will understand that the roller apparatus guide 900 may be designed to fit any mobile communication device of any length, width and height. Indeed, the cavity 925 formed by the inner wall 905 may be sized to be substantially the same as the mobile communication device to be protected. The fit of the mobile communication device within the cavity 925 may be important to ensure that the applied protective film is correctly positioned.

In one embodiment, the cavity 925 formed by the inner wall 905 may be closed on a back side by a thin backing layer spanning the length and width of the cavity 925. The thin backing layer may be integrated into the body of the apparatus guide 900 and constructed out of the same or different material. In this implementation, the cavity 925 may be formed by the inner wall 905 and the thin backing layer and the depth of the cavity 925 may be designed to maintain the feature of the mobile communication device being flush with the top surface of the apparatus guide 900 when placed into the cavity 925. In this manner, the user may be able to use the apparatus guide 900 in various situations where a flat support surface is not readily available.

In one embodiment, the roller apparatus guide 900 may include different removable and insertable portions to enable the roller apparatus guide 900 to fit multiple devices depending on which portions are inserted. For example, consider a first device having dimensions of 5 inches long by 4 inches wide by 1 inch thick and a second device having dimensions of 3 inches long by 2 inches wide by 1 inch thick. The cavity 925 of the roller apparatus guide 900 may initially be designed to fit the larger first device, but not the smaller second device. However, when a molded portion of 5 inches long by 4 inches wide by 1 inch thick having a cavity 925 that is 3 inches long by 2 inches wide by 1 inch thick is inserted in the cavity 925 of the roller apparatus guide 900, the resulting roller apparatus guide 900 may then be utilized to fit the smaller second device. Other molded portions may be swapped in and out depending on the size and shape of the mobile communication device. Alternatively, the user may include further additional portions or remove inserted portions as desired to fit the particular devices. In this manner, roller apparatus guide 900 may be versatile and cater to different mobile communication devices of different sizes.

The structure of the roller apparatus guide 900 having been described, attention will now be turned to the functionality as shown in FIGS. 9B-9H.

Figure 9B:
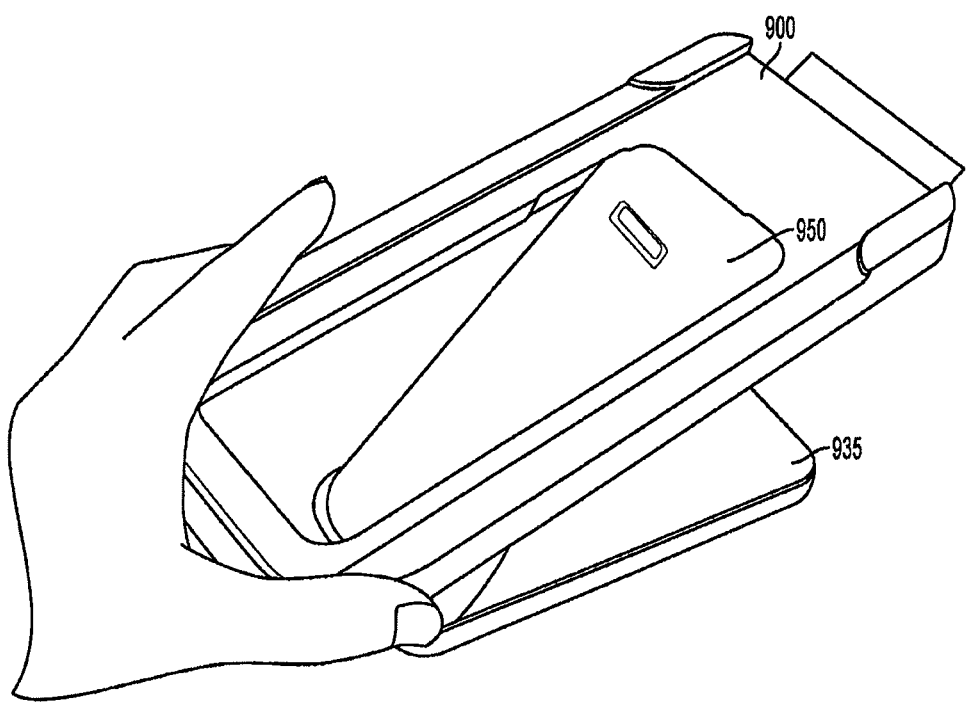
FIG. 9B illustrates a roller guiding apparatus with a film attached prior to mounting of the mobile communication device according to one or more embodiments described herein.

FIG. 9B illustrates the roller apparatus guide 900, a film 950 to be applied, and a mobile communication device 935. The film 950 may be temporarily held to the roller apparatus guide 900 via an adhesive (not shown). As the film 950 is sized to correspond to the mobile communication device 935

(which is to be inserted or mounted by the roller apparatus guide 900), the film 950 may freely move in and out of the cavity 925 as shown.

Figure 9C:
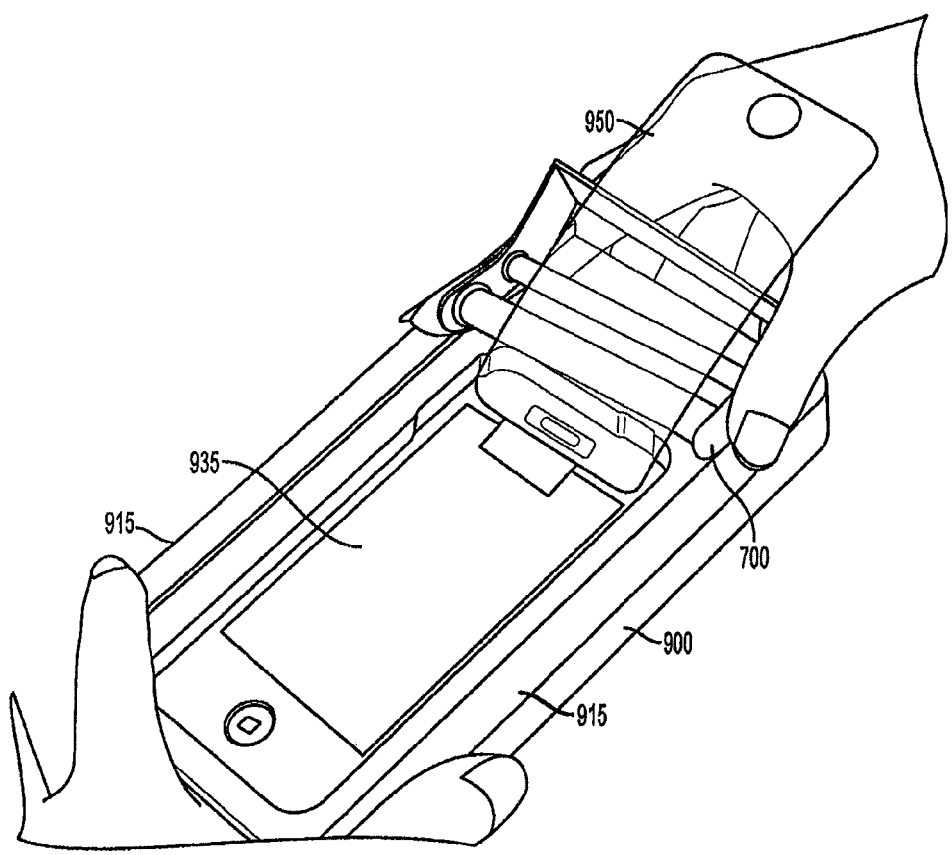
FIG. 9C illustrates a roller guiding apparatus with the mobile communication device mounted according to one or more embodiments described herein.

FIG. 9C illustrates the roller apparatus guide 900 fully mounted on the mobile communication device 935, and with the film 950 in a ready-to-be-applied position. While roller 700 is shown in FIG. 9C, any roller may be used in conjunction with the roller apparatus guide 900. The roller 700 may be placed at the top of the roller apparatus guide 900, with the film-contacting outer cores held between the roller guiding rails 915. The distance between the roller guiding rails 915 may be configured to be the same as the length of the roller 700 thereby forming a path for the movement of the roller 700 along a surface of the mobile communication device 935. In other words, the roller guiding rails 915 create a pathway to prevents the roller 700 from veering off the intended positional direction of application, and thus ensuring that the film 950 is applied at a correct position and providing a simplified methodology for imparting the desired precision during the film application process.

Figure 9D:
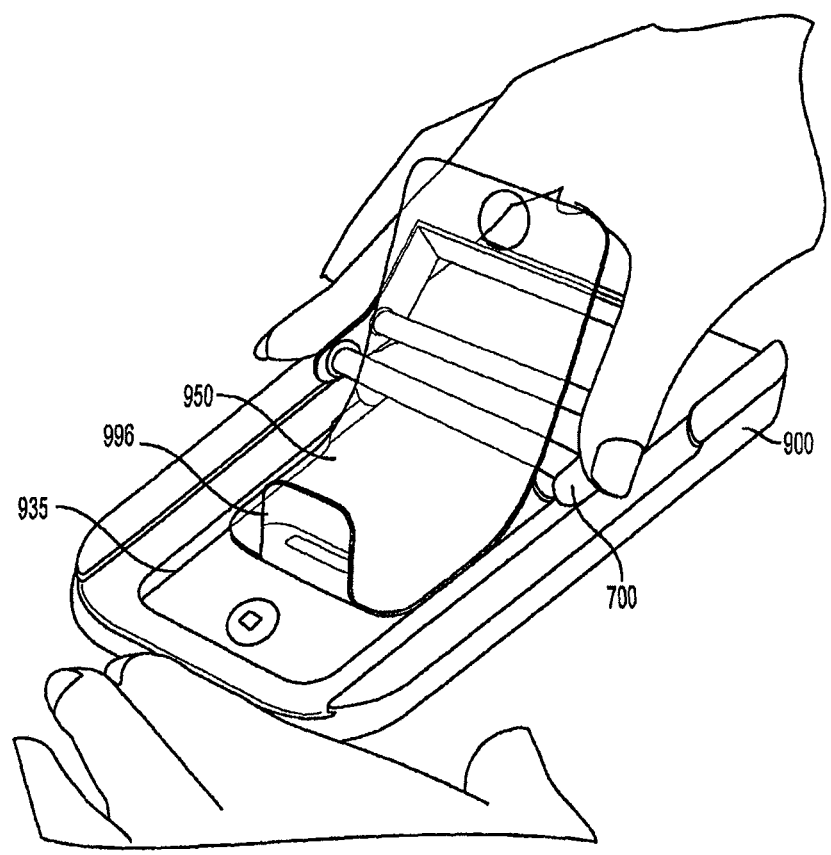
FIG. 9D illustrates a roller guiding apparatus with the mobile communication device mounted and with a roller applying a film on the mobile communication device according to one or more embodiments described herein.

As shown in FIG. 9D, after the user pulls a film tab 996 to expose the protective layer of the film 950 and as the user begins to move the roller 700 from one end of the mobile communication device 935 to the other end of the mobile communication device 935 in the direction of arrow 955, the backing of the film 950 is automatically removed while the exposed protective film is applied to the mobile communication device 935.

Figure 9E:
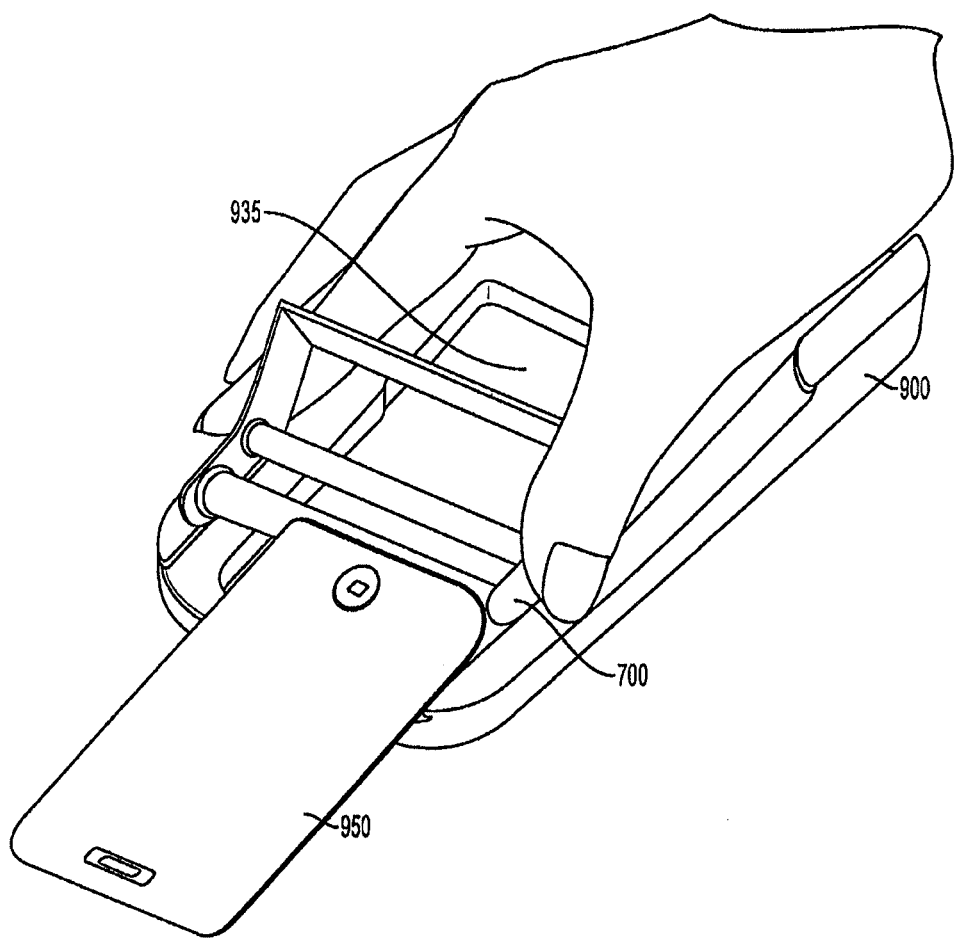
FIG. 9E illustrates a roller guiding apparatus with the mobile communication device mounted and with a roller almost completed with applying a film on the mobile communication device according to one or more embodiments described herein.
Figure 9F:
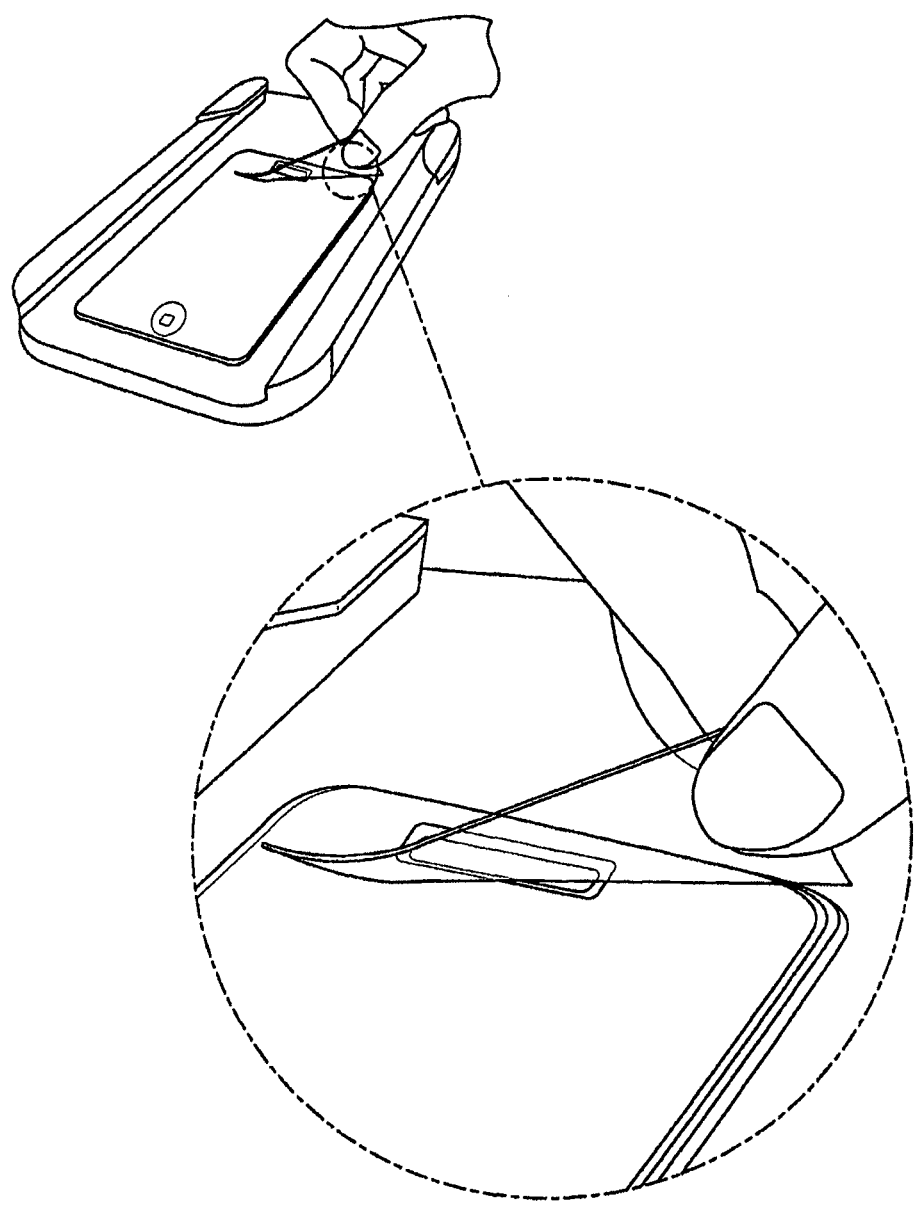
FIG. 9F illustrates a film tab removal process according to one or more embodiments described herein.

FIG. 9E illustrates the roller 700 as the user is about to conclude application of the film 950. As shown, the film backing of the film 950 is substantially separated from the applied portion of the film 950. As shown in FIG. 9F, after the user finishes using the roller 700 to apply the film when the electronic device 935 is situated within the roller guide apparatus 900, the user may remove any adhesive tabs that may have been used to attach the film 950 to the roller guide apparatus 900 for ease of positioning of the film 950 during the application process.

Figure 9G:
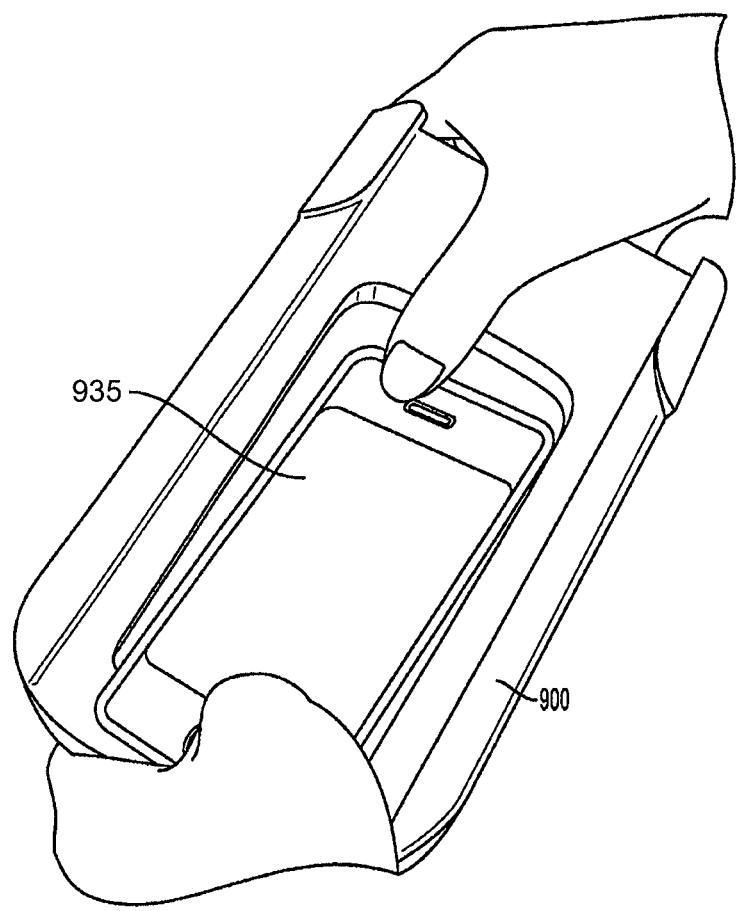
FIG. 9G illustrates removing the mobile communication device from the roller guiding apparatus according to one or more embodiments described herein.
Figure 9H:
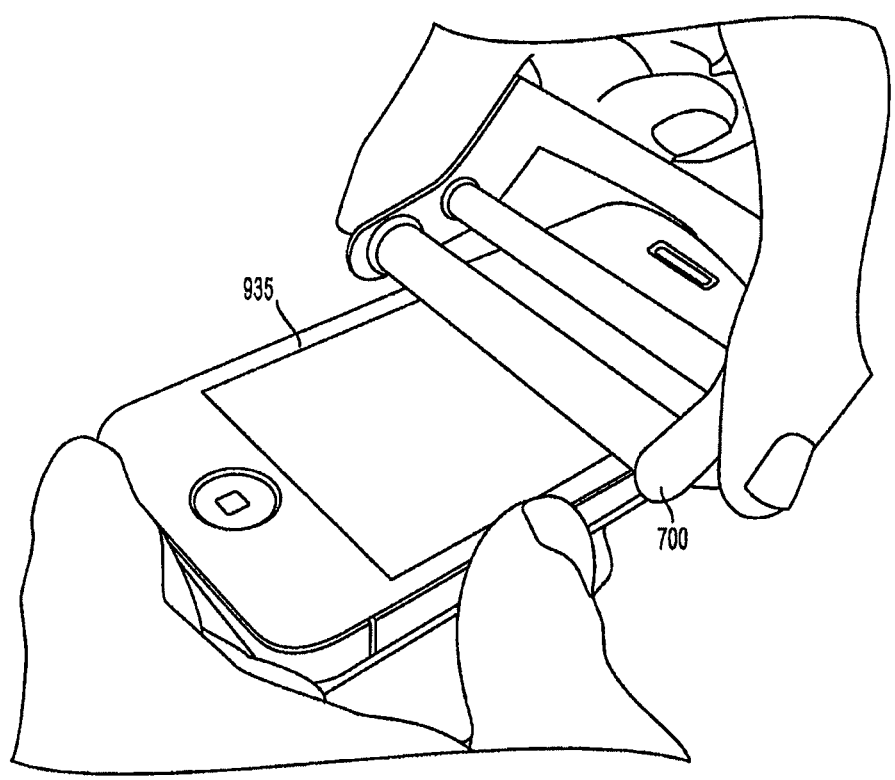
FIG. 9H illustrates reinforcement of the applied film by using the roller after the mobile communication device is removed from the roller guiding apparatus according to one or more embodiments described herein.

As shown in FIG. 9G, the user may remove the mobile communication device 935 from the roller apparatus guide 900 by simply popping it out or lifting the roller apparatus guide 900 off the mobile communication device 935. If desired, the user may use the roller 700 and reinforce the applied film in the manner shown in FIG. 9H.

Figure 10A:
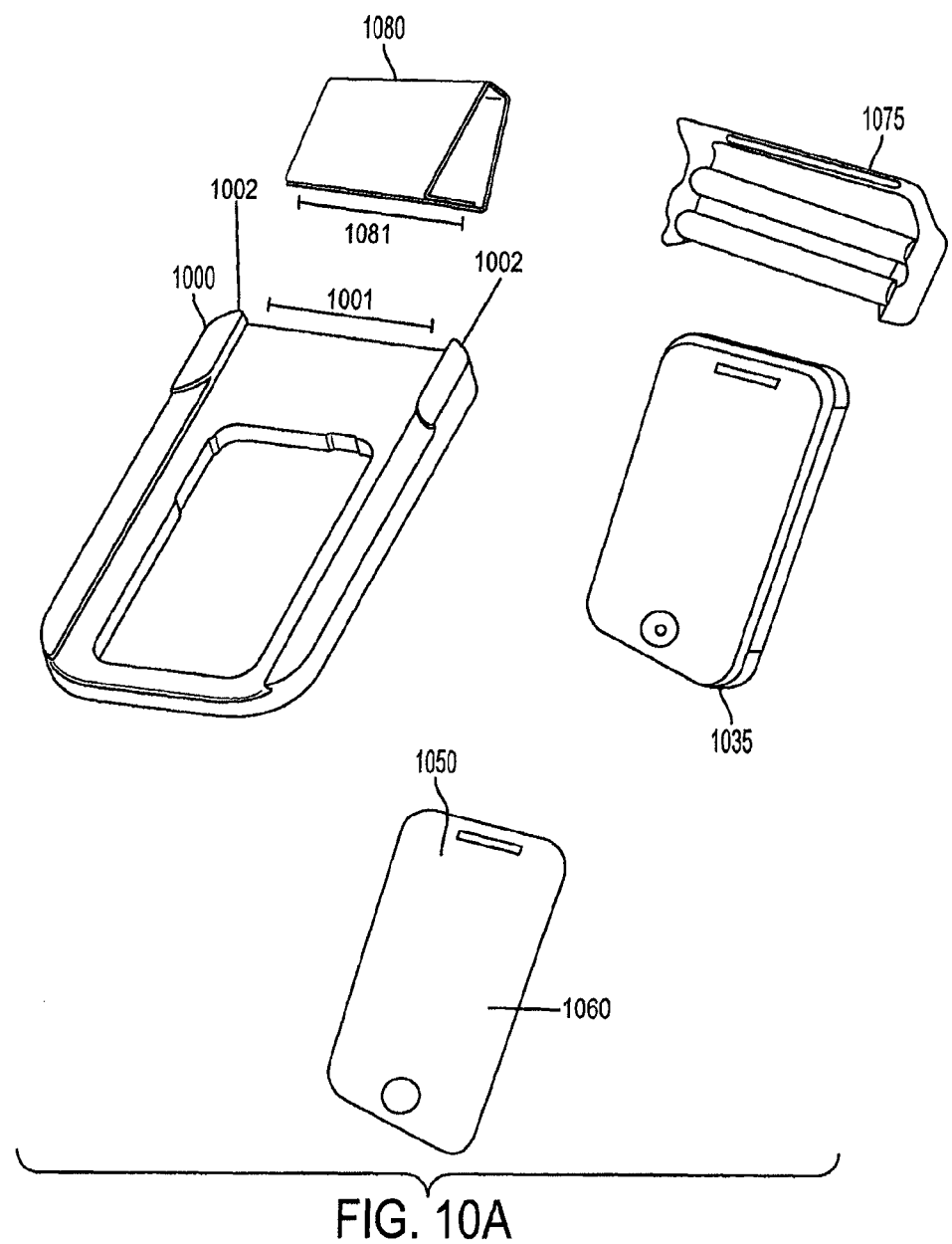
FIG. 10A illustrates a roller apparatus, a mobile communication device, a film to be applied to the mobile communication device, a roller apparatus guide and a wedge according to one or more embodiments described herein.

FIG. 10A illustrates a system including a roller apparatus 1075 (which may be, for example, the roller apparatus 800, 700, 600, etc.), a roller apparatus guide 1000 (which may be, for example, the roller apparatus 900), a mobile communication device 1035, a protective film 1050 (with a backing portion 1060) to be applied to a mobile communication device 1035, and a wedge 1080. Unlike the embodiment illustrated in FIGS. 9A-9G, a wedge 1080 is incorporated in FIG. 10A to help the user apply the film 1050 to the mobile communication device 1035. While not drawn to scale, in one embodiment, a length 1081 of the wedge 1080 may be configured to fit within a distance 1001 between rails 1002.

Figure 10B:
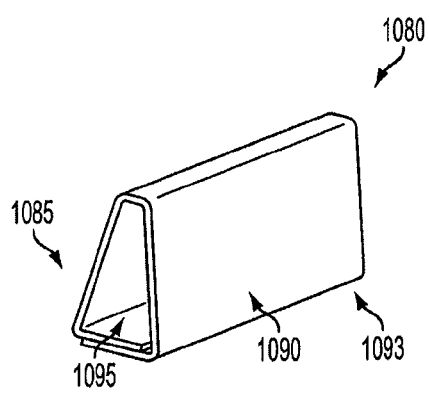
FIG. 10B illustrates the wedge of FIG. 10A according to one or more embodiments described herein.
Figure 10C:
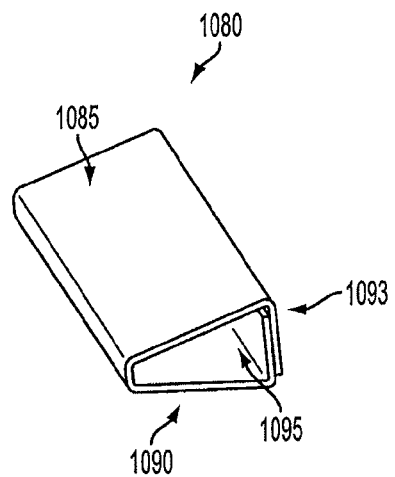
FIG. 10C illustrates the wedge of FIG. 10A according to one or more embodiments described herein.
Figure 10D:
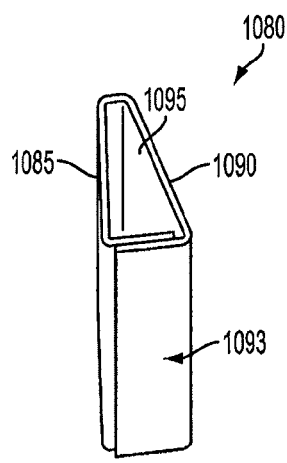
FIG. 10D illustrates the wedge of FIG. 10A according to one or more embodiments described herein.

FIG. 10B illustrates the wedge 1080 apart from the previously described portions of the film application system. The wedge 1080 may be substantially triangular in shape, although minor variations are allowed provided that the functionality of the wedge 1080 remains (as described with respect to FIGS. 10E-10I). The wedge 1080 may comprise three adjacent, connected surfaces 1085, 1090 and 1093 forming the structure of the wedge 1080. The spacing 1095 created by the connecting of surfaces 1085, 1090 and 1093 may be hollow or, in one embodiment, may be filled. As illustrated in FIGS. 10C-10D, the surfaces 1085, 1090 and 1093 may be substantially flat and may have surface areas that are equal or different to one another (e.g., the surface area of the surface 1093 may be 50% smaller than the surface area of the surface 1085 and/or 1090).

Figure 10E:
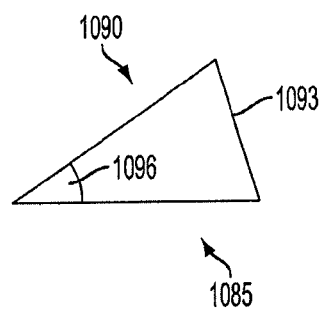
FIG. 10E illustrates the wedge of FIG. 10A according to one or more embodiments described herein.

As shown in FIG. 10E, the acute angle 1096 created between surfaces 1085 and 1090 may be in the range of 0-90°, but preferably between 5-15°. The angle 1096 is selected to allow the wedge 1080 to be manipulated by the roller 1075 during the application process.

Any of a plurality of materials including paper, cardboard, plastic, metal, wood, or combination thereof may be used to construct the wedge 1080 to facilitate the main functionality of the wedge 1080. The user may initially separate the backing 1060 of the protective film 1050 by pushing the roller apparatus 1075 into the wedge. Advantageously, the user does not need to manually peel the backing 1060, and instead may rely on the wedge 1080, thereby simplifying the process for the user. In other words, the user can simply install the protective film 1050 by moving the roller apparatus 1075 in one smooth, continuous motion.

FIGS. 10E-10J illustrate how the wedge 1080 may be used with the roller apparatus 1075 and the roller guiding apparatus 1000 to apply the film 1050 to the mobile communication device 1035.

Figure 10F:
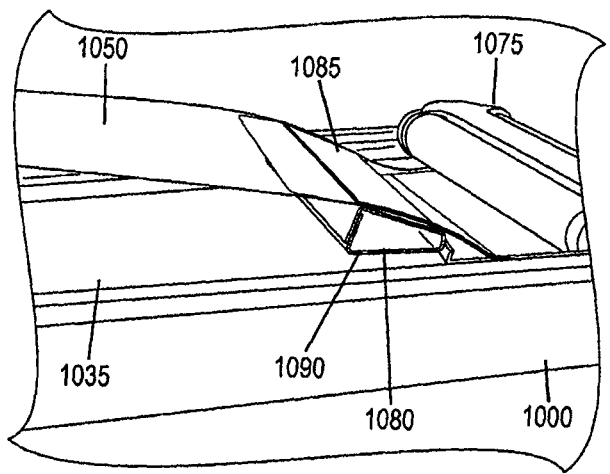
FIG. 10F illustrates a roller guiding apparatus with the mobile communication device mounted and with a roller apparatus initially positioned prior to the applying of a film on the mobile communication device with the assistance of a wedge according to one or more embodiments described herein.

As illustrated in FIG. 10F, initially, the wedge 1080 may be positioned between the film 1050 and the mobile communication device 1035 after the mobile communication device 1035 is mounted by the roller guiding apparatus 1000. Here, the roller apparatus 1075 is placed at the top of the roller guiding apparatus 1000. As shown, in this position, the film 1050 is separated from the surface of the mobile communication device 1035 by the wedge 1080. In this initial position, the surface 1090 of the wedge 1080 contacts the top of the mobile communication device 1035 and/or the top of the roller guiding apparatus 1000 while the other surface 1085 of the wedge 1080 contacts the film 1050. In addition, the surface 1085 adheres to a backing of film 1050 which assists the film application process as illustrated in the following figures.

Figure 10G:
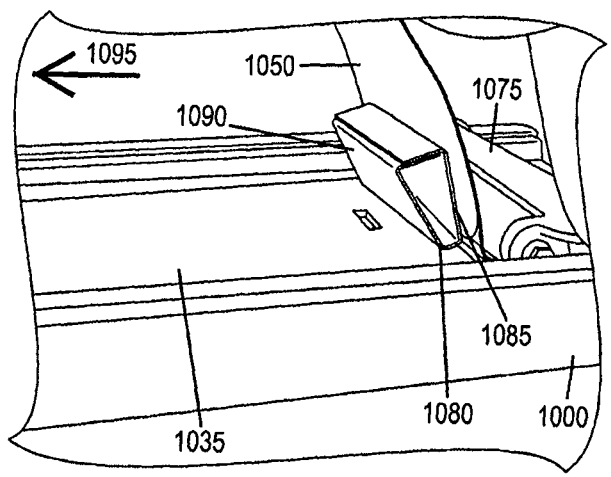
FIG. 10G illustrates a roller guiding apparatus with the mobile communication device mounted and with a roller apparatus initially positioned to apply a film on the mobile communication device with the assistance of a wedge according to one or more embodiments described herein.

FIG. 10G illustrates the behavior of the wedge. As user moves the roller apparatus 1075 across the roller guiding apparatus 1000 in the direction shown by arrow 1095, the roller apparatus 1075 places pressure on the film 1050 and/or the wedge 1080. This in turn causes the surface 1090 to begin to move away from the top surface of the mobile communication device 1035 and/or the top of the roller guiding apparatus 1000, while the surface 1085 continues to adhere to the backing of the film 1050. Furthermore, the configuration of the wedge 1080 and the attachment to the backing portion 1060 of the film 1050 lends itself to be flipped upwards as shown in FIG. 10G.

Figure 10H:
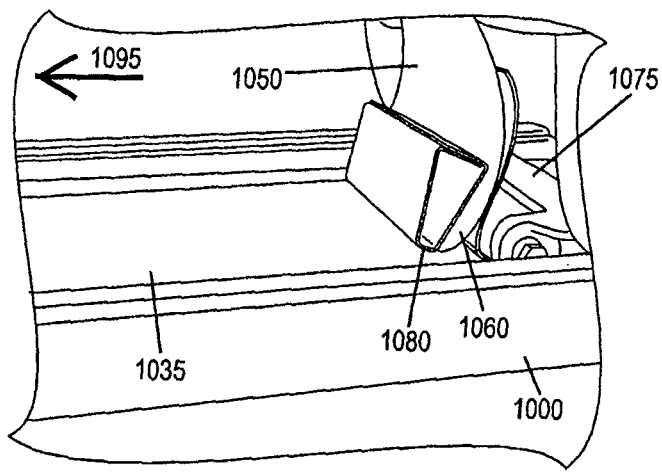
FIG. 10H illustrates a roller guiding apparatus with the mobile communication device mounted and with a roller apparatus being maneuvered to apply the film on the mobile communication device with the assistance of a wedge according to one or more embodiments described herein.

As the user continues to move the roller apparatus 1075 in the direction of arrow 1095, the backing portion 1060 of the film 1050 begins to separate from the portion of the film to be applied to the mobile communication device 1035 and at this position, the wedge 1080 is no longer in contact with the surface of the mobile communication device 1035. Instead, the wedge 1080 is separated from the top of the mobile communication device by the backing of the film 1050 as shown in FIG. 10H.

Figure 10I:
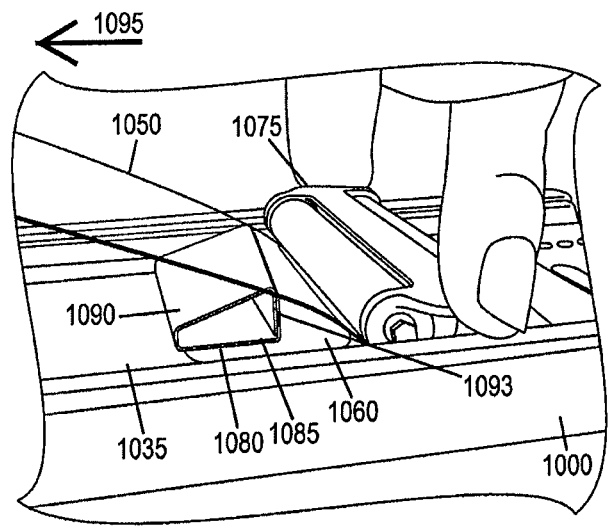
FIG. 10I illustrates a roller guiding apparatus with the mobile communication device mounted and with a roller apparatus moving the wedge during the application of a film to the mobile communication device according to one or more embodiments described herein.

FIG. 10I illustrates how the wedge 1080 works with the roller apparatus 1075 to separate the backing portion 1060 of the film 1050 and applies the exposed protective portion of the film 1050 onto the mobile communication device 1035. As the user continues to move the roller apparatus 1075 in the direction of arrow 1095, the pressure exerted by the roller apparatus 1075 causes the wedge 1080 to "flip over" such that the backing portion 1060, which still adheres on one side to the surface 1085 of the wedge 1080, is pulled away from the protective portion of the film 1050. In addition, the portion of the film 1050 that remains to be separated is kept out of the way by resting on the edge between the surfaces 1090 and 1093 of the wedge.

Figure 10J:
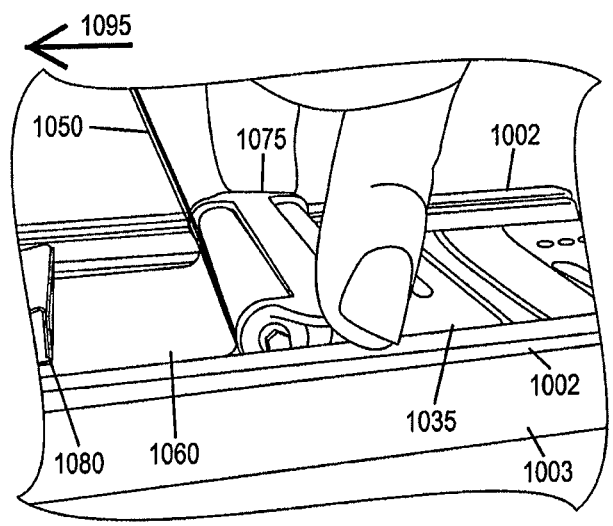
FIG. 10J illustrates a roller guiding apparatus with the mobile communication device mounted and with a roller apparatus positioned to apply a film on the mobile communication device with wedge located at the bottom portion of the mobile communication device according to one or more embodiments described herein.

As the user manipulates the roller apparatus 1075 from the position shown in FIG. 10I from the end proximal to the initial position and down through the rails 1002 of the roller apparatus guide 1000 to complete the film application process, the roller apparatus 1077 continues to apply force that moves the wedge 1080 away from its initial position as shown in FIG. 10J. Eventually, the wedge 1080 and the attached backing portion 1060 of the film 1050 may be completely separated from the protective portion of the film 1050 applied to the mobile communication device 1035, thereby completing the film application process.

In the manner described, the wedge 1080 may be utilized to assist the user to apply a film 1050 to a mobile communication device 1035 in conjunction with the roller apparatus 1075 and the roller guiding apparatus 1000.

Skilled artisans may implement the described functionality in varying ways for each particular application, but such implementation decisions should not be interpreted as causing a departure from the scope of the disclosed apparatus and/or methods.

The previous description of examples is provided to enable any person of ordinary skill in the art to make or use the disclosed methods and apparatus. Various modifications to these examples will be readily apparent to those skilled in the art, and the principles defined herein may be applied to other examples without departing from the spirit or scope of the disclosed method and apparatus. The elements and uses of the above-described embodiments can be rearranged and combined in manners other than specifically described above, with any and all permutations within the scope of invention. The described embodiments are to be considered in all respects only as illustrative and not restrictive and the scope of the invention is, therefore, indicated by the appended claims rather than by the foregoing description. All changes which come within the meaning and range of equivalency of the claims are to be embraced within their scope. In addition, the invention is not limited to the illustrated embodiments, and all embodiments of the invention need not necessarily achieve all the advantages or purposes or possess all characteristics identified herein.

What is claimed is:

1. A film application system for applying a protective film to a screen of a mobile device, the system comprising:
    an apparatus for receiving the mobile device, and including:
        a cavity having a length, a width, and a depth, and four sides each extending from a bottom of the cavity to an upper boundary of the cavity to define the depth of the cavity, with a first pair of the four sides facing opposite each other, and a second pair of the four sides facing opposite each other, the cavity configured to receive the mobile device such that the mobile device is positioned between the first pair of the four sides and is positioned between the second pair of the four sides, and
        a supporting surface extending outward from the upper boundary of the cavity and being positioned outside of the cavity;
    a protective film having a backing portion and an application portion, and having a first end and a second end extending away from the first end of the protective film such that the protective film extends along the length of the cavity and extends over the screen of the mobile device when the mobile device is positioned in the cavity, the application portion configured to be applied to the screen of the mobile device to cover the screen of the mobile device when the mobile device is positioned in the cavity and the backing portion is separated from the application portion; and
    a tab having a first end and a second end, the first end of the tab attached to the supporting surface and the second end of the tab attached to the first end of the protective film to thereby attach the first end of the protective film to the supporting surface, the application portion being sandwiched between the second end of the tab and the backing portion, and
    the tab being configured such that the first end of the tab and the application portion each remain attached to the supporting surface while the backing portion is being separated from the application portion.

2. The system of claim 1, wherein each side of the first pair extends along the width of the cavity and each side of the second pair extends along the length of the cavity.

3. The system of claim 1, wherein the protective film is sized such that the second end of the protective film may move in and out of the cavity when the mobile device is not positioned in the cavity.

4. The system of claim 1, wherein the protective film is configured such that the backing portion is positioned between the application portion and the mobile device when the mobile device is positioned in the cavity and the protective film extends over the mobile device.

5. The system of claim 1, wherein the cavity has a rectangular shape.

6. The system of claim 1, wherein the apparatus includes a backing portion defining the bottom of the cavity and spanning the length and the width of the cavity.

7. A film application system for applying a protective film to a screen of a mobile device, the system comprising:
    a substantially rectangular apparatus for receiving the mobile device, and sized to be held within a user's hand and including:
        an inner wall defining a cavity having a length, a width, and a depth, with the inner wall extending from a bottom of the cavity to an upper boundary of the cavity to define the depth of the cavity, the cavity configured to receive the mobile device, the inner wall configured to prevent the mobile device from moving along the length of the cavity when the mobile device is positioned in the cavity, and the inner wall configured to prevent the mobile device from moving along the width of the cavity when the mobile device is positioned in the cavity, and
        a supporting surface extending outward from the upper boundary of the cavity and being positioned outside of the cavity; and
    a protective film having a backing portion and an application portion, and having a first end and a second end extending away from the first end of the protective film such that the protective film extends along the length of the cavity and extends over the mobile device when the mobile device is positioned in the cavity, the application portion configured to be applied to the screen of the mobile device to cover the screen of the mobile device when the mobile device is positioned in the cavity and the backing portion is separated from the application portion; and
    a tab having a first end and a second end, the first end of the tab attached to the supporting surface and the second end of the tab attached to the first end of the protective film to thereby attach the first end of the protective film to the supporting surface, the application portion being sandwiched between the second end of the tab and the backing portion, and the tab being configured such that the first end of the tab and the application portion each remain attached to the supporting surface while the backing portion is being separated from the application portion.

8. The system of claim 7, wherein the inner wall is shaped to bound the mobile device on four sides of the mobile device when the mobile device is positioned in the cavity.

9. The system of claim 7, wherein the protective film has a length from the first end to the second end and a width, with the length and the width of the protective film each being sized smaller than the respective length and the respective width of the cavity such that the second end of the protective film may move in and out of the cavity when the mobile device is not positioned in the cavity.

10. The system of claim 9, wherein the supporting surface extends from the upper boundary of the cavity to an outer edge of the substantially rectangular apparatus.

11. The system of claim 10, wherein the substantially rectangular apparatus includes a backing portion defining the bottom of the cavity and spanning the length and the width of the cavity.

12. A method of applying a protective film to a screen of a mobile device, the method comprising:

inserting the mobile device into a cavity of an apparatus that is sized to be larger than the mobile device, the apparatus including:

an inner wall defining the cavity, which has a length, a width, and a depth, with the inner wall extending from a bottom of the cavity to an upper boundary of the cavity to define the depth of the cavity, the cavity configured to receive the mobile device, with the length of the cavity being sized substantially the same as a length of the mobile device such that the inner wall prevents the mobile device from moving along the length of the cavity when the mobile device is positioned in the cavity, and the width of the cavity being sized substantially the same as a width of the mobile device such that the inner wall prevents the mobile device from moving along the width of the cavity when the mobile device is positioned in the cavity, and a supporting surface extending outward from the upper boundary of the cavity and being positioned outside of the cavity; and separating a backing portion of a protective film from an application portion of the protective film, the protective film having a first end and a second end, the first end of the protective film being attached to a tab, the tab being attached to the supporting surface to thereby attach the first end of the protective film to the supporting surface, the second end of the protective film extending away from the first end of the protective film such that the protective film may extend along the length of the cavity and extend over the mobile device when the mobile device is positioned in the cavity; and applying the application portion of the protective film to the screen of the mobile device while the mobile device is positioned in the cavity and the application portion remains attached to the tab and the tab remains attached to the supporting surface, to cover the screen of the mobile device, and wherein separating the backing portion of the protective film from the application portion of the protective film includes starting to peel the backing portion away from the application portion in a direction away from the first end of the protective film while the application portion remains attached to the tab and the tab remains attached to the supporting surface.

13. The method of claim 12, wherein the protective film has a length from the first end to the second end and a width, with the length and the width of the protective film each being sized smaller than the respective length and the respective width of the cavity such that the second end of the protective film may move in and out of the cavity when the mobile device is not positioned in the cavity.

14. The method of claim 12, wherein applying the application portion of the protective film to the screen of the mobile device includes pressing the application portion to the screen of the mobile device.

15. The method of claim 12, wherein applying the application portion of the protective film to the screen of the mobile device includes covering the entirety of the screen of the mobile device with the application portion.

* * * * *